US008407636B2

(12) United States Patent
Iwashita

(10) Patent No.: US 8,407,636 B2
(45) Date of Patent: Mar. 26, 2013

(54) CLOCK DOMAIN CROSSING VERIFICATION SUPPORT

(75) Inventor: Hiroaki Iwashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/962,785

(22) Filed: Dec. 8, 2010

(65) Prior Publication Data

US 2011/0161903 A1 Jun. 30, 2011

(30) Foreign Application Priority Data

Dec. 25, 2009 (JP) ................................. 2009-295906

(51) Int. Cl.
G06F 17/50 (2006.01)
G06F 9/455 (2006.01)

(52) U.S. Cl. ........ 716/106; 716/104; 716/107; 716/108; 716/113; 703/14

(58) Field of Classification Search ........................ None
See application file for complete search history.

(56) References Cited

U.S. PATENT DOCUMENTS

| 6,115,763 | A  | * | 9/2000  | Douskey et al. ................. 710/72 |
| 6,327,684 | B1 | * | 12/2001 | Nadeau-Dostie et al. ..... 714/731 |
| 7,356,789 | B2 | * | 4/2008  | Ly et al. ......................... 716/108 |
| 2002/0120896 | A1 | | 8/2002 | Wang et al. |
| 2005/0268265 | A1 | * | 12/2005 | Ly et al. ............................ 716/6 |
| 2007/0255988 | A1 | | 11/2007 | Wang et al. |
| 2009/0132880 | A1 | | 5/2009 | Wang et al. |

FOREIGN PATENT DOCUMENTS

| JP | 2004-530865 | | 10/2004 |
| JP | 2009-9318 | | 1/2009 |
| WO | 02/067001 | A1 | 8/2002 |

\* cited by examiner

*Primary Examiner* — A. M. Thompson
(74) *Attorney, Agent, or Firm* — Staas & Halsey LLP

(57) ABSTRACT

A computer-readable, non-transitory medium stores therein a verification support program that causes a computer to execute a procedure. The procedure includes first detecting a state change in a circuit and occurring when input data is given to the circuit. The procedure also includes second detecting a state change in the circuit and occurring when the input data partially altered is given to the circuit. The procedure further includes determining whether a difference exists between a series of state changes detected at the first detecting and a series of state changes detected at the second detecting. The procedure also includes outputting a determination result obtained at the determining.

15 Claims, 23 Drawing Sheets

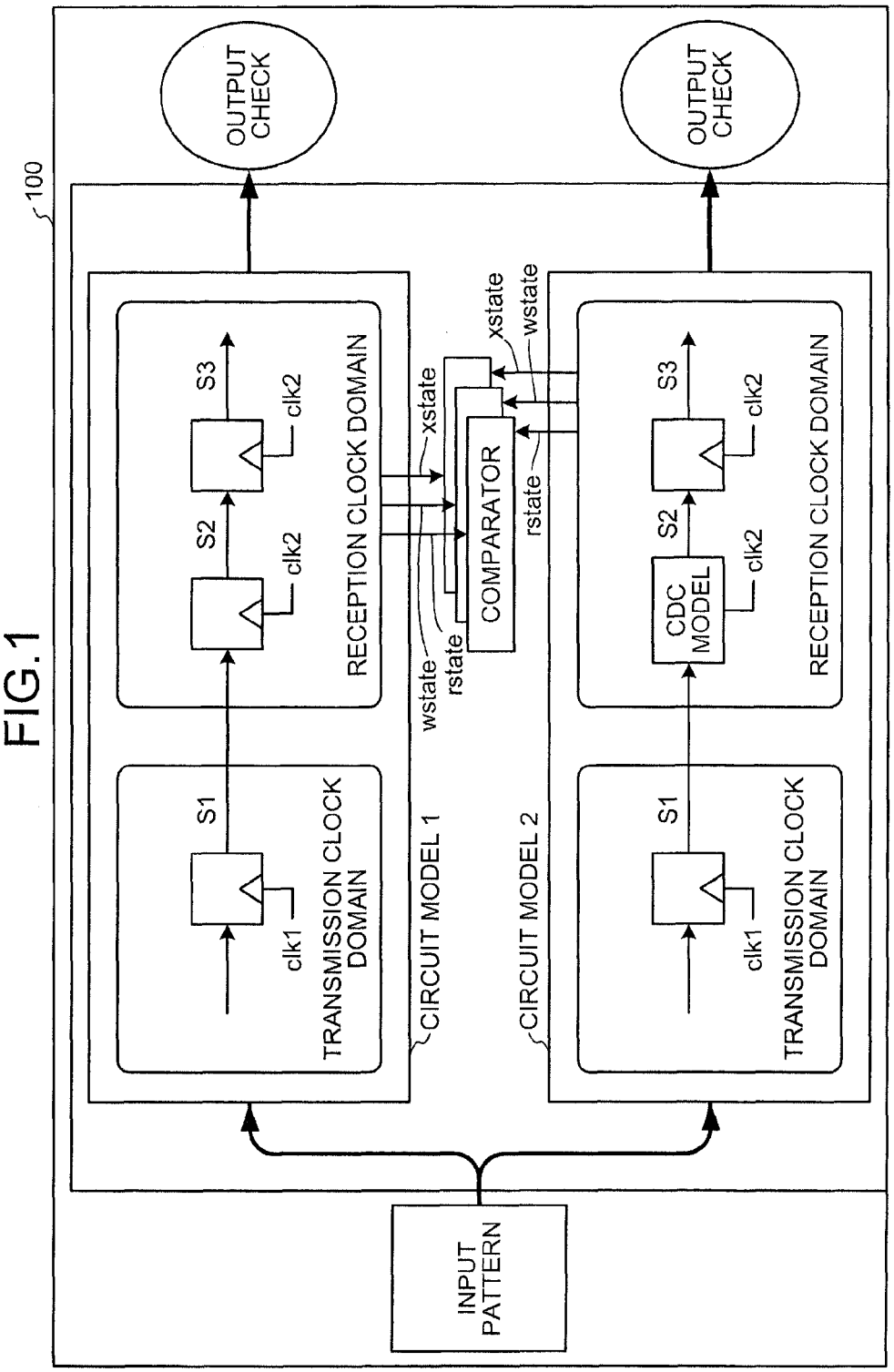

FIG.2

```
input clk2, reset;
input req;
input [15:0] addr;
output ack, abt;
output [7:0] data;

reg req1, req2;
reg ack, abt;
reg dataready, timeout;
reg [1:0] rstate;
reg [15:0] raddr;
reg [7:0] rdata, data;

always 23(posedge clk2) begin
   req1 <= req;
   req2 <= req1;
end always 23(posedge clk2) begin
   if (reset) begin
      ack <= 1'b0;
      abt <= 1'b0;
      rstate <= 2'b00;
   end
   else begin
      case (rstate)
      2'b00: // idle
         if (req2) begin
            raddr <= addr;
            rstate <= 2'b01;
         end
      2'b01: // waiting
         if (dataready) begin
            ack <= 1'b1;
            data <= rdata;
            rstate <= 2'b10;
         end
         else if (timeout) begin
            abt <= 1'b1;
            rstate <= 2'b11;
         end
      2'b10: // sending
         if (!req2) begin
            ack <= 1'b0;
            rstate <= 2'b00;
         end
      2'b11: // aborting
         if (!req2) begin
            abt <= 1'b0;
            rstate <= 2'b00;
         end
      endcase
   end
end
...
```
~200

CLOCK DOMAIN CROSSING VERIFICATION SUPPORT

CROSS REFERENCE TO RELATED APPLICATIONS

This application is based upon and claims the benefit of priority of the prior Japanese Patent Application No. 2009-295906, filed on Dec. 25, 2009, the entire contents of which are incorporated herein by reference.

FIELD

The embodiments discussed herein are related to semiconductor integrated circuit verification.

BACKGROUND

Conventionally, several types of clocks are present in a semiconductor integrated circuit. Generally, a block unit supplied with a clock is called clock domain, and the delivery of data between different clock domains is called clock domain crossing (CDC).

Data in one clock domain (hereinafter, "transmission clock domain") is delivered to a different clock domain (hereinafter "reception clock domain"), regardless of the timing of a clock used in the reception clock domain.

The data that is input regardless of the timing of the clock in the reception clock domain results in noncompliance with a setup time or hold time and may cause a metastable state in output from a flip-flop (FF).

A metastable state is an unstable state in which both logical value 0 and logical value 1 may be determined. The effect of a metastable state may propagate as a logical value difference to an FF or a combinational circuit downstream, causing the semiconductor integrated circuit to malfunction.

Elimination of the metastable state is impossible as far as CDC is occurring in the semiconductor integrated circuit. Nevertheless, verification that the development of a metastable state does not result in a malfunction of the semiconductor integrated circuit is demanded. Logical verification using an ordinary FF model, however, does not take into account the effect of the metastable state.

FIG. 25 is an explanatory diagram of an example of logical verification using an ordinary FF model. In a circuit model 1, an output end of a transmission FF in a transmission clock domain is connected to an input end of a reception FF in a reception clock domain. A timing chart indicates a case where data (S1) output from the transmission FF does not comply with a setup time of a clock clk2 when the data (S1) is delivered to the reception FF. Despite the noncompliance, however, output data (S2) from the reception FF gives a logical value 1.

To deal with the problem that the effect of the metastable state is not considered, as depicted in FIG. 25, a model of the reception FF is altered into a model enabling simulation of the effect of the metastable state (hereinafter "CDC model") and verification is carried using such a model (hereinafter "CDC verification") (see, e.g., Japanese Laid-Open Patent Publication No. 2009-9318).

FIG. 26 is an explanatory diagram of an example of logical verification using a CDC model. In a circuit model 2, an output end of a transmission FF in a transmission clock domain is connected to an input end of a reception FF in a reception clock domain. The reception FF is provided as a CDC model. A timing chart indicates a case where data (S1) output from the transmission FF does not comply with the setup time of the clk2 when the data (S1) is delivered to the reception FF.

Because of noncompliance with the setup time, output data (S2) from the reception FF creates a metastable state. At a rising edge of the clk2, therefore, an FF receiving the data S2 as input data takes on the metastable state to output an unpredictable logical value (0 or 1).

A verification result given by CDC verification is affected by the metastable state, which makes fault-cause analysis difficult in CDC verification. In an ordinary case, therefore, logical verification before a model change is carried out first (hereinafter "function verification") to confirm that regular functions have no problem. CDC verification is then carried out using the same input pattern used in function verification to confirm that no action that is not compliant with a design specification arises even if random actions are added by a CDC model.

A design for test (DFT) system that detects or pinpoints a failure caused by CDC is known as a system for conducting a test (see, e.g., Japanese National Publication of International Patent Application No. 2004-530865).

An input pattern is, however, a pattern that is made for exclusive use in function verification and is not necessarily an input pattern appropriate for CDC verification. Conventionally, therefore, when transition to an erroneous internal state occurs due to a CDC-caused fault, some input patterns may not cause the effect of the fault to propagate to external output, which poses a problem in that an omission in detecting malfunction may occur.

CDC occurs at several thousand locations in the semiconductor integrated circuit; therefore, the distance from each CDC location to a fault determining location (e.g., output terminal) on a logical circuit is large. This poses a problem of difficulty in identifying CDC as a fault cause.

Even in a properly designed logical circuit, a fault determining location is distant from a CDC location via multiple FFs, combinational circuits, etc. and thus, appears as a shift in signal change timing (cycle unit). Simply comparing the result of ordinary function verification with the result of CDC verification, cycle by cycle, therefore, results in detection of a number of inconsistencies. This leads to a problem of erroneously determining normal operation to be faulty operation.

SUMMARY

According to an aspect of an embodiment, a computer-readable, non-transitory medium stores therein a verification support program that causes a computer to execute first detecting a state change in a circuit and occurring when input data is given to the circuit; second detecting a state change in the circuit and occurring when the input data partially altered is given to the circuit; determining whether a difference exists between a series of state changes detected at the first detecting and a series of state changes detected at the second detecting; and outputting a determination result obtained at the determining.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is an explanatory diagram of one embodiment.

FIG. 2 is an explanatory diagram of an example of RTL description of a circuit subject to verification.

DESCRIPTION OF EMBODIMENTS

Figure 3:
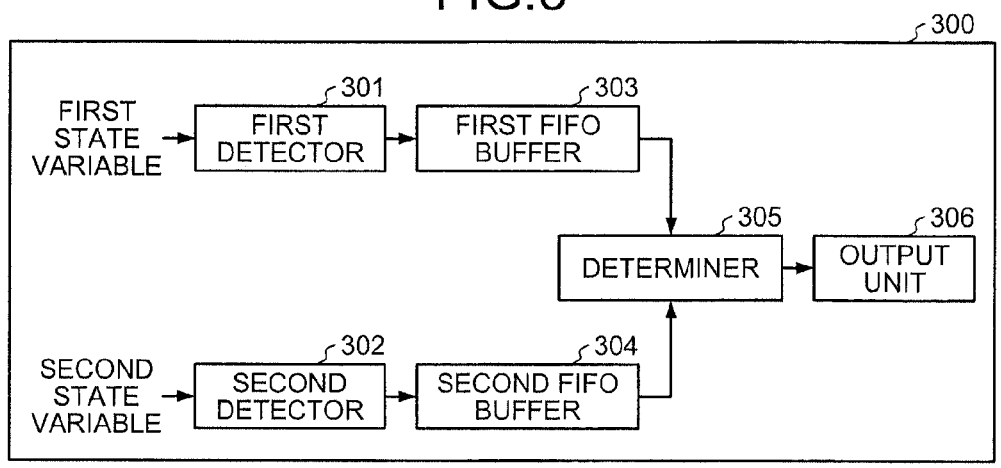
FIG. 3 is an explanatory diagram of an example of a comparator template.

Preferred embodiments of the present invention will be explained with reference to the accompanying drawings.

FIG. 1 is an explanatory diagram of one embodiment. A test bench 100 is a simulation model. The test bench 100 includes a circuit model 1, a circuit model 2, a comparator for each variable representing an in-circuit state (hereinafter "state variable"), an input pattern, and an output check. The output check indicates that a simulation result, such as an output terminal and a variable to be confirmed in function verification, has been output. The input pattern is the same input pattern used in function verification.

Each comparator has a first detector, a first first-in-first-out (FIFO) buffer, a second detector, a second FIFO buffer, a determiner, and an output unit. In FIG. 1, rstate is extracted from a reception clock domain in a circuit model 1 and from a reception clock domain in a circuit model 2, and is input to the first comparator.

In the circuit model 1, a reception FF in the reception clock domain is an ordinary FF model. In the circuit model 2, a reception FF in the reception clock domain is a CDC model.

In the test bench 100, the same input pattern is given to the circuit model 1 and to the circuit model 2. When simulation is carried out using the test bench 100, the first detector detects a change in a state variable in the circuit model 1 while the second detector detects a change in a state variable in the circuit model 2 in the comparator.

The first FIFO buffer stores the state at the time of detection of a change in a state variable by the first detector while the second FIFO buffer stores the state at the time of detection of a change in a state variable by the second detector. The first FIFO buffer and the second FIFO buffer each store states sequentially.

A series of state changes (hereinafter "state transition series") means, for example, a series of states stored in the first FIFO buffer and a series of states stored in the second FIFO buffer.

The determiner determines whether a difference exists between a state stored in the first FIFO buffer and a state stored in the second FIFO buffer.

The following is an example of a state variable for each rising edge of the clk2.

rstate in circuit model 1: State0→State1→State2
rstate in circuit model 2: State0→State0→State1→State2

States stored in the first FIFO buffer and those stored in the second FIFO buffer in the above case are as follows.

first FIFO buffer: State0→State1→State2
second FIFO buffer: State0→State1→State2

In this case, the first and the second FIFO buffers each store the same states and thus, the determiner determines that no difference in state exists.

The following is an example of a state variable for each rising edge of the clk2.

rstate in circuit model 1: State0→State1→State2
rstate in circuit model 2: State0→State0→State2→State2

States stored in the first FIFO buffer and those stored in the second FIFO buffer in the above case are as follows.

first FIFO buffer: State0→State1→State2
second FIFO buffer: State0→State2

In this case, the states stored in the first FIFO buffer are different from the states stored in the second FIFO buffer and thus, the determiner determines that a difference in state exists. As a result, the output unit outputs inconsistency information.

In this manner, even if transition to an erroneous internal state occurs due to a CDC-caused fault, malfunction is detected accurately.

First to third embodiments will be described to describe the embodiments of the present invention in detail. An example of simulation model (test bench) generation will be described in the description of the first and second embodiments. An example of simulation using a simulation model generated in the first or second embodiment will be described in the description of the third embodiment.

In the first embodiment, a state variable is detected from a circuit subject to verification and a comparator is generated for each state variable using a comparator template, to build a test bench.

FIG. 2 is an explanatory diagram of an example of RTL description of a circuit subject to verification. Circuit information 200 is RTL description information of a reception clock domain included in RTL description information of a circuit model 1, which is the circuit subject to verification. In the circuit information 200, clk2 represents a clock signal, and reset, req, and addr represent other clock domains or a global signal. The circuit information 200 is stored in a computer-accessible memory device, and the circuit models 1 and 2 are also stored in a computer-accessible memory device.

FIG. 3 is an explanatory diagram of an example of a comparator template. A template 300 is a comparator template, and has a first detector 301, a first FIFO buffer 303, a second detector 302, a second FIFO buffer 304, a determiner 305, and an output unit 306. The template 300 is, specifically, for example, information written in a hardware description language, etc., as depicted in FIG. 2, serving as a model used only for simulation.

The first detector 301 receives input of a first state variable, and detects changes in the first state variable. The first FIFO buffer 303 stores the state at the time of a state change detected by the first detector 301. The second detector 302 receives input of a second state variable, and detects changes in the second state variable. The second FIFO buffer 304 stores the state at the time of a state change detected by the second detector 302. The determiner 305 compares a series of states stored in the first FIFO buffer 303 with a series of states stored in the second FIFO buffer 304. The output unit 306 outputs the comparison result obtained by the determiner 305. The template 300 is stored in a computer-accessible memory device.

Figure 4:
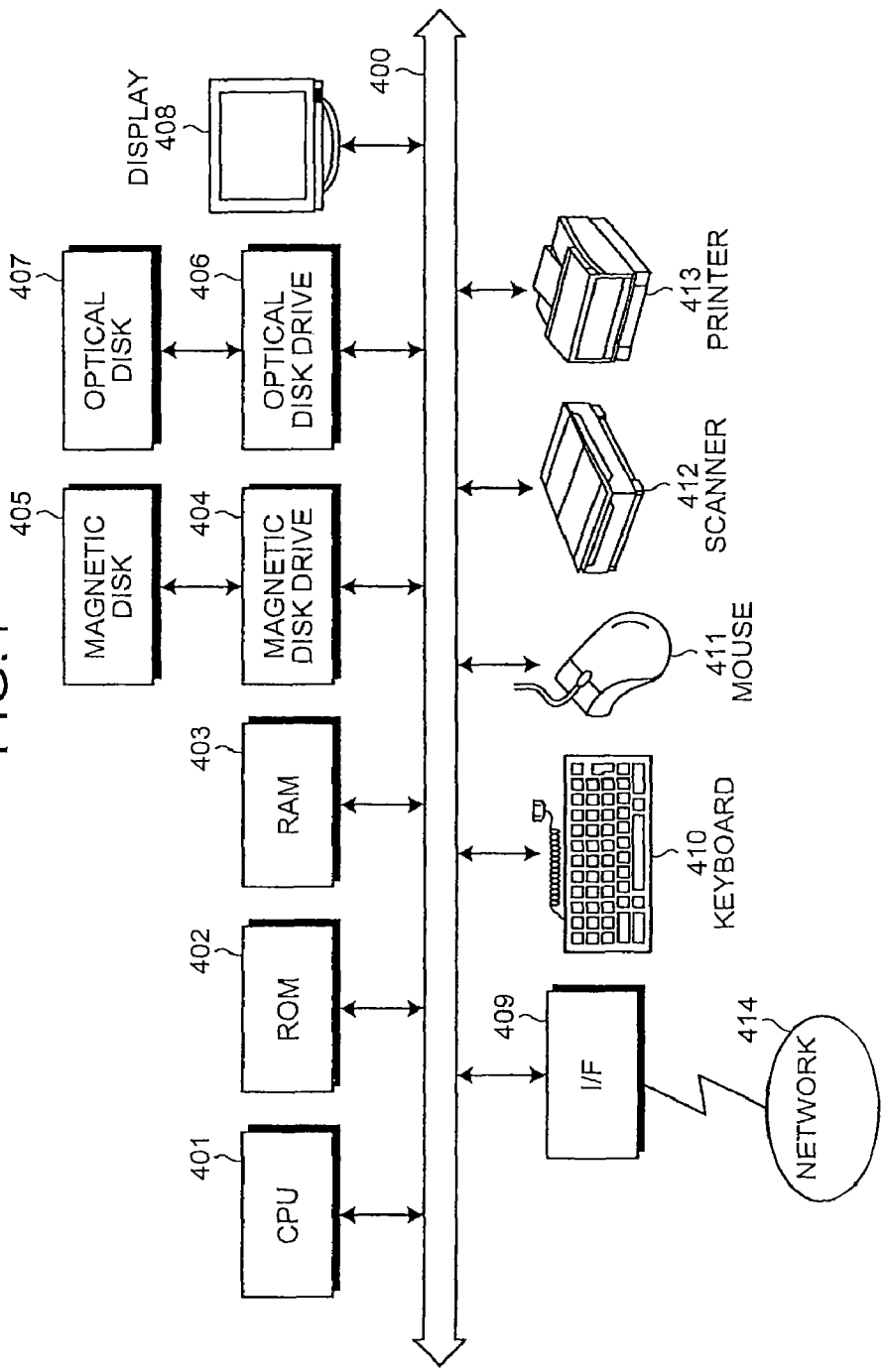
FIG. 4 is a block diagram of a hardware configuration of a verification support apparatus.

FIG. 4 is a block diagram of a hardware configuration of a verification support apparatus according to the embodiments. As depicted in FIG. 4, the verification support apparatus includes a central processing unit (CPU) 401, a read-only memory (ROM) 402, a random access memory (RAM) 403, a magnetic disk drive 404, a magnetic disk 405, an optical disk drive 406, an optical disk 407, a display 408, an interface (I/F) 409, a keyboard 410, a mouse 411, a scanner 412, and a printer 413, respectively connected by a bus 400.

The CPU 401 governs overall control of the verification support apparatus. The ROM 402 stores therein programs such as a boot program. The RAM 403 is used as a work area of the CPU 401. The magnetic disk drive 404, under the control of the CPU 401, controls the reading and writing of data with respect to the magnetic disk 405. The magnetic disk 405 stores therein data written under control of the magnetic disk drive 404.

The optical disk drive 406, under the control of the CPU 401, controls the reading and writing of data with respect to the optical disk 407. The optical disk 407 stores therein data written under control of the optical disk drive 406, the data being read by a computer.

The display 408 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 408.

The I/F 409 is connected to a network 414 such as a local area network (LAN), a wide area network (WAN), and the Internet through a communication line and is connected to other apparatuses through the network 414. The I/F 409 administers an internal interface with the network 414 and controls the input/output of data from/to external apparatuses. For example, a modem or a LAN adaptor may be employed as the I/F 409.

The keyboard 410 includes, for example, keys for inputting letters, numerals, and various instructions and performs the input of data. Alternatively, a touch-panel-type input pad or numeric keypad, etc. may be adopted. The mouse 411 is used to move the cursor, select a region, or move and change the size of windows. A track ball or a joy stick may be adopted provided each respectively has a function similar to a pointing device.

The scanner 412 optically reads an image and takes in the image data into the verification support apparatus. The scanner 412 may have an optical character reader (OCR) function as well. The printer 413 prints image data and text data. The printer 413 may be, for example, a laser printer or an ink jet printer.

Figure 5:
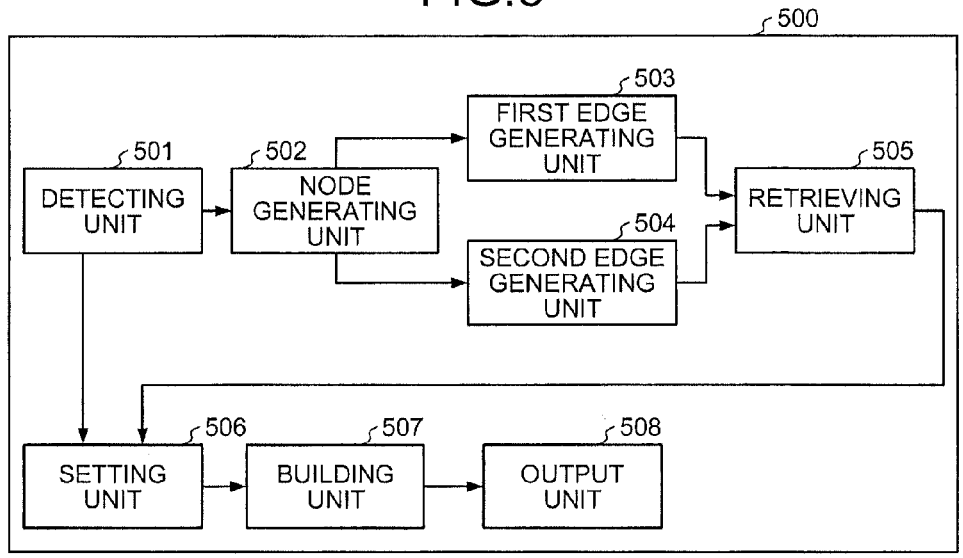
FIG. 5 is a block diagram of a functional configuration of a verification support apparatus according to a first embodiment.

FIG. 5 is a block diagram of a functional configuration of a verification support apparatus according to the first embodiment. A verification support apparatus 500 includes a detecting unit 501, a node generating unit 502, a first edge generating unit 503, a second edge generating unit 504, a retrieving unit 505, a setting unit 506, a building unit 507, and an output unit 508. These functional units (the detecting unit 501 to the output unit 508), are implemented, for example, by the CPU 401 executing a program stored in a memory device such as the ROM 402, the RAM 403, the magnetic disk 405, and the optical disk 407 depicted in FIG. 4, or via the I/F 409.

The details of the processes executed by the node generating unit 502, the first edge generating unit 503, the second edge generating unit 504, and the retrieving unit 505 will be described in the second embodiment.

The detecting unit 501 detects a state variable representing the state of a circuit subject to verification, from first description information of the circuit. The first description information is equivalent to the circuit model 1. Specifically, for example, the CPU 401 detects a clock synchronization assignment statement from the circuit information 200, and detects a variable appearing on the left side of the assignment statement, as a candidate variable.

Clock synchronization is expressed as "posedge clk2" in the circuit information 200, and a clock synchronization assignment statement is an assignment statement included in a clock synchronization statement. For example, "req1<=req;" is a clock synchronization assignment statement.

The following are detected as candidate variables.
req1
req2
ack
abt
rstate
raddr For example, the CPU 401 detects a candidate variable having a bit width of 2 or more from among the candidate variables, whereby the following is detected.
rstate
raddr Examples of detecting a state variable from detected candidate variables are as follows.

In a first example, the CPU 401 detects from among the candidate variables and as a state variable, a candidate variable for which the assignment statement has a right term that is a constant, whereby rstate is detected as the state variable.

In a second example, the CPU 401 detects from among candidate variables and as a state variable, a candidate variable referred to in the form of comparison with a constant, whereby rstate is detected as the state variable.

In a third example, the CPU 401 detects from among candidate variables and as a state variable, a candidate variable whose name includes "state", whereby rstate is detected as the state variable.

Figure 6:
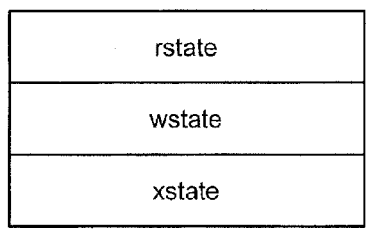
FIG. 6 is an explanatory diagram of an example of a detection result as detected state variables.

FIG. 6 is an explanatory diagram of an example of a detection result as detected state variables. A state variable list indicates the detection result obtained by the detecting unit 501. Although only rstate is written in the circuit information 200, multiple state variables are present in the reception clock domain.

The setting unit 506 sets the bit width of a state variable to be input to a comparator, to the bit width of a state variable detected by the detecting unit 501. Specifically, for example, the CPU 401 reads out the comparator template and sets the input bit width on the template to 2 bits, which is the bit width of rstate, and generates a comparator for rstate.

The building unit 507 sets a state variable in the first description information as a first variable in the first detector and sets the state variable identical to the above state variable in second description information, a portion of which differs from the first description information, as a second variable in the second detector, and gives the first and the second variables to the comparator set by the setting unit 506. The building unit 507 thus builds a simulation model that is a combination of the first description information, the second description information, and the comparator model. The second description information is equivalent to the circuit model 2, the model of the reception FF in the reception clock domain thereof being different from that in the circuit model 1. Specifically, for example, the CPU 401 connects rstate in the circuit model 1 to the first state variable in the comparator and rstate in the circuit model 2 to the second state variable in the comparator. The simulation model may be built in combination with an input pattern, as in the case of the test bench 100.

The output unit 508 has a function of outputting a building result obtained by the building unit 507. For example, the output unit 508 outputs the test bench 100 of FIG. 1. Forms of output include display on the display 408, printout by the printer 413, and transmission to an external device through the I/F 409. A building result may be stored to a memory device such as the RAM 403, the magnetic disk 405, and the optical disk 407.

Conventionally, a verification engineer may newly make an input pattern for CDC verification; however, this consumes an enormous amount of time, is troublesome, and incurs significant cost as well. In the first embodiment, an input pattern for function verification is used and a simulation model is generated automatically, thereby shortening the verification period and saving the verification engineer trouble.

Figure 7:
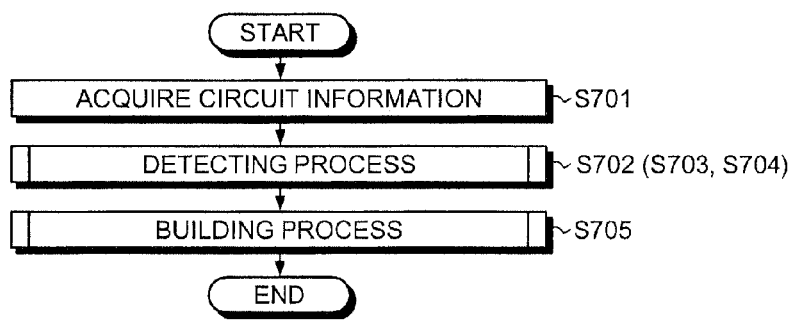
FIG. 7 is a flowchart of an example of a verification support procedure by the verification support apparatus according to the first embodiment.

FIG. 7 is a flowchart of an example of a verification support procedure by the verification support apparatus 500 according to the first embodiment. The verification support apparatus 500 acquires the circuit information (step S701), carries out a detecting process (step S702 (S703 or S704)) and carries out a building process (step S705), ending a series of processes. The detecting process is carried out by executing any one of steps S702, S703, and S704.

Figure 8:
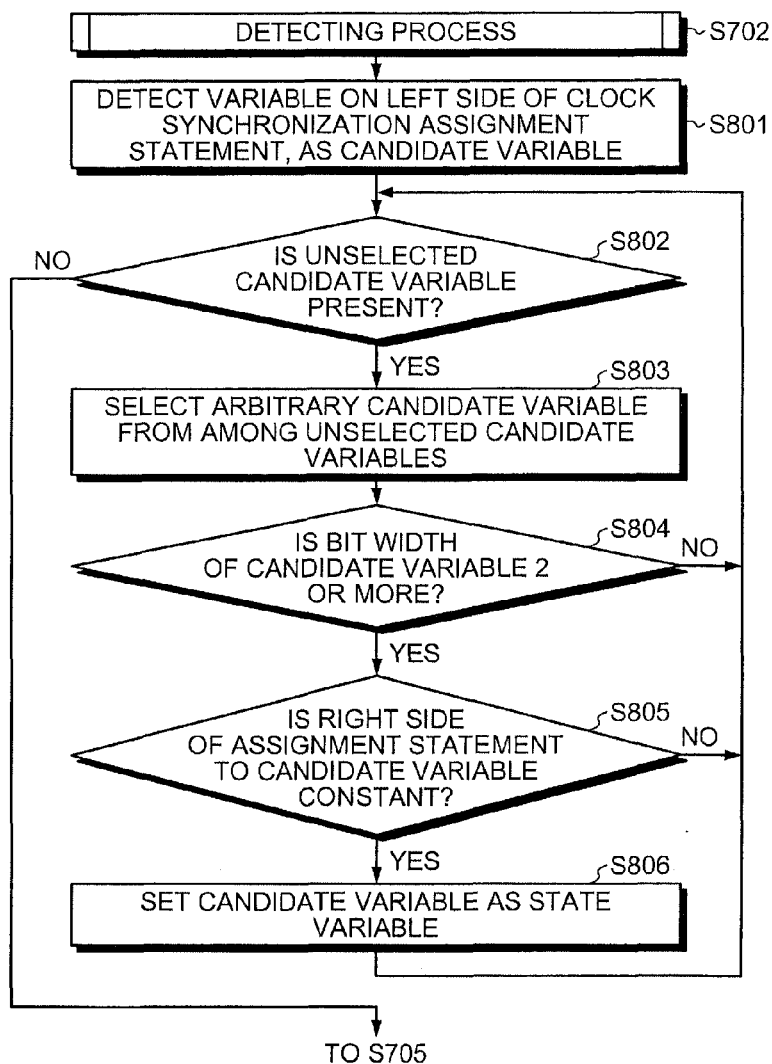
FIG. 8 is a flowchart of detailed description of a detecting process (step S702) depicted in FIG. 7.

FIG. 8 is a flowchart of detailed description of the detecting process (step S702) depicted in FIG. 7. The verification support apparatus 500 causes the detecting unit 501 to detect as a candidate variable, a variable on the left side of a clock synchronization assignment statement (step S801), and determines whether an unselected candidate variable is present (step S802).

If an unselected candidate variable is present (step S802: YES), the verification support apparatus 500 selects an arbitrary candidate variable from among unselected candidate variables (step S803), and determines whether the bit width of the selected candidate variable is at least 2 (step S804).

If the bit width of the candidate variable is 2 or more (step S804: YES), the verification support apparatus 500 determines whether the right side of an assignment statement to the candidate variable is a constant (step S805). If the right side is a constant (step S805: YES), the verification support apparatus 500 sets the candidate variable as a state variable (step S806), and returns to step S802.

If the bit width of the candidate variable is not 2 or more (step S804: NO) or if the right side is not a constant (step S805: NO), the verification support apparatus 500 returns to step S802.

If an unselected candidate variable not present (step S802: NO), the verification support apparatus 500 proceeds to step S705.

Figure 9:
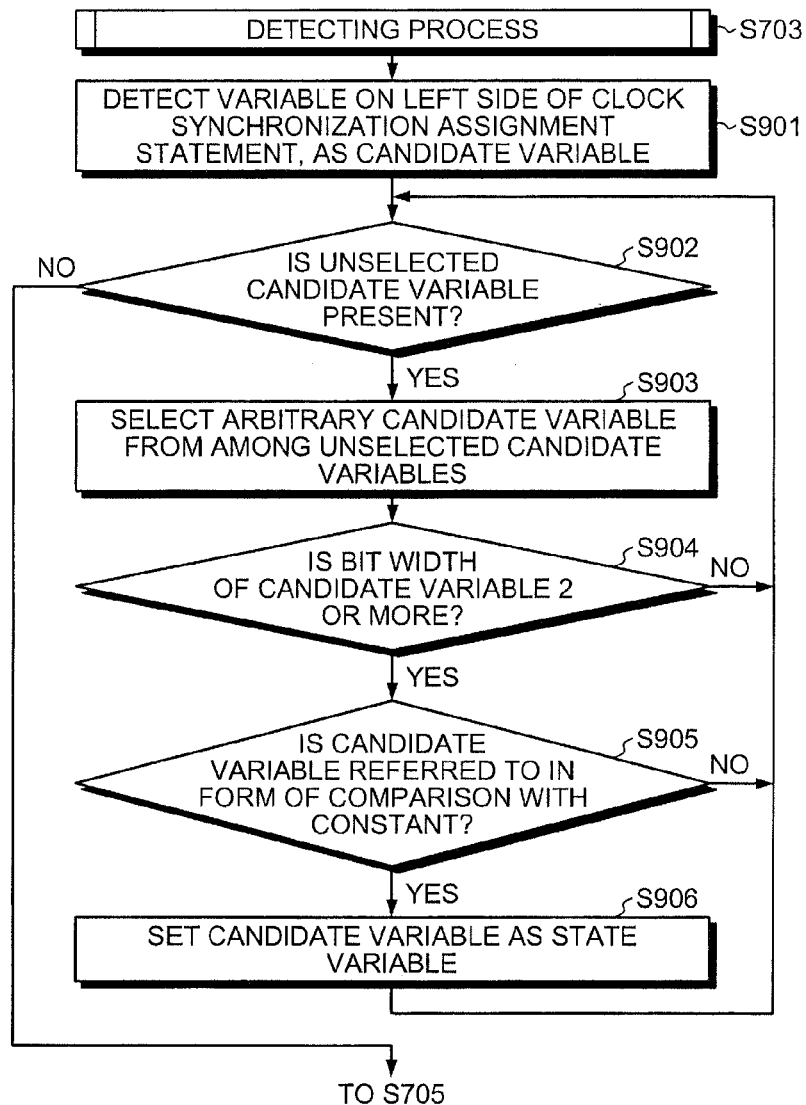
FIG. 9 is a flowchart of detailed description of the detecting process (step S703) depicted in FIG. 7.

FIG. 9 is a flowchart of detailed description of the detecting process (step S703) depicted in FIG. 7. The processing at steps S901 to S904 depicted in FIG. 9 is identical to that at steps S801 to S804 depicted in FIG. 8, respectively, and step S906 depicted in FIG. 9 is identical to step S806 depicted in FIG. 8; and therefore, description thereof is omitted in further description, and only step S905 will be described.

Following step S904, the verification support apparatus 500 determines whether the candidate variable is referred to in the form of comparison with a constant (step S905). If the candidate variable is referred to in the form of comparison with a constant (step S905: YES), the verification support apparatus 500 proceeds to step S906. If the candidate variable is not referred to in the form of comparison with a constant (step S905: NO), the verification support apparatus 500 returns to step S902.

Figure 10:
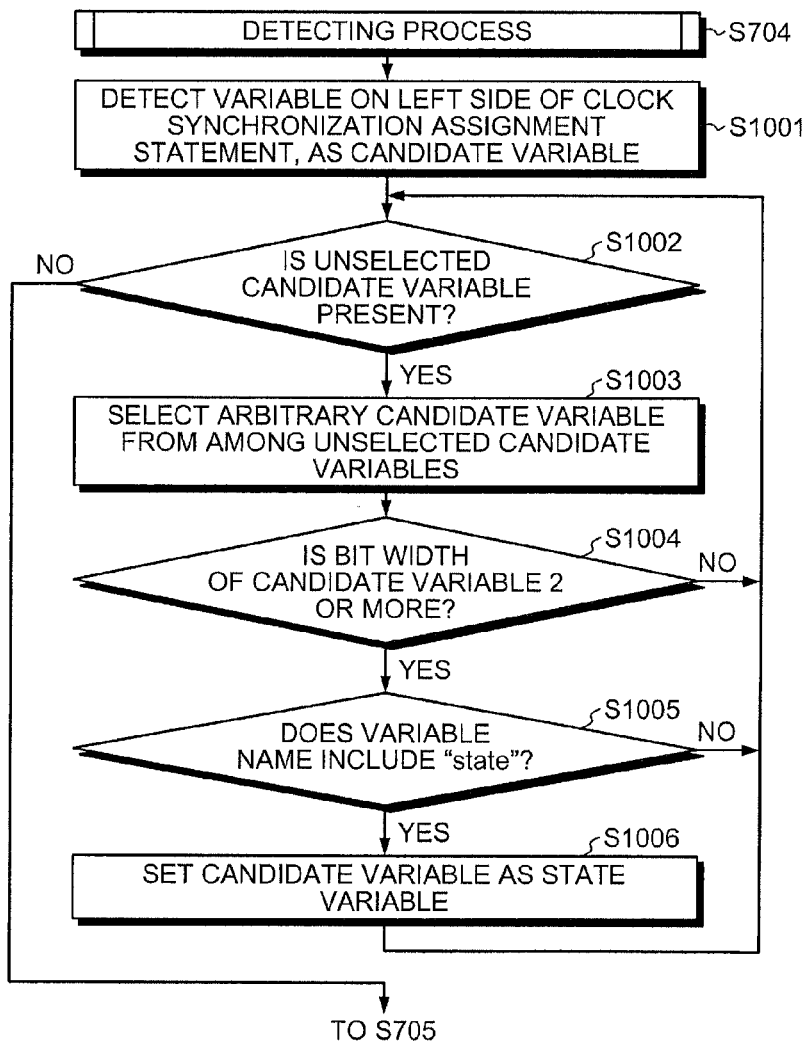
FIG. 10 is a flowchart of detailed description of the detecting process (step S704) depicted in FIG. 7.

FIG. 10 is a flowchart of detailed description of the detecting process (step S704) depicted in FIG. 7. The processing at steps S1001 to S1004 depicted in FIG. 10 are is identical to that at steps S801 to S804 depicted in FIG. 8, respectively, and step S1006 depicted in FIG. 10 is identical to step S806 depicted in FIG. 8; and therefore, description thereof is omitted in further description, and only step S1005 will be described.

Following step S1004, the verification support apparatus 500 determines whether the variable name of the candidate variable includes "state" (step S1005). If the variable name of the candidate variable includes "state" (step S1005: YES), the verification support apparatus 500 proceeds to step S1006. If the variable name of the candidate variable does not include "state" (step S1005: NO), the verification support apparatus 500 returns to step S1002.

Figure 11:
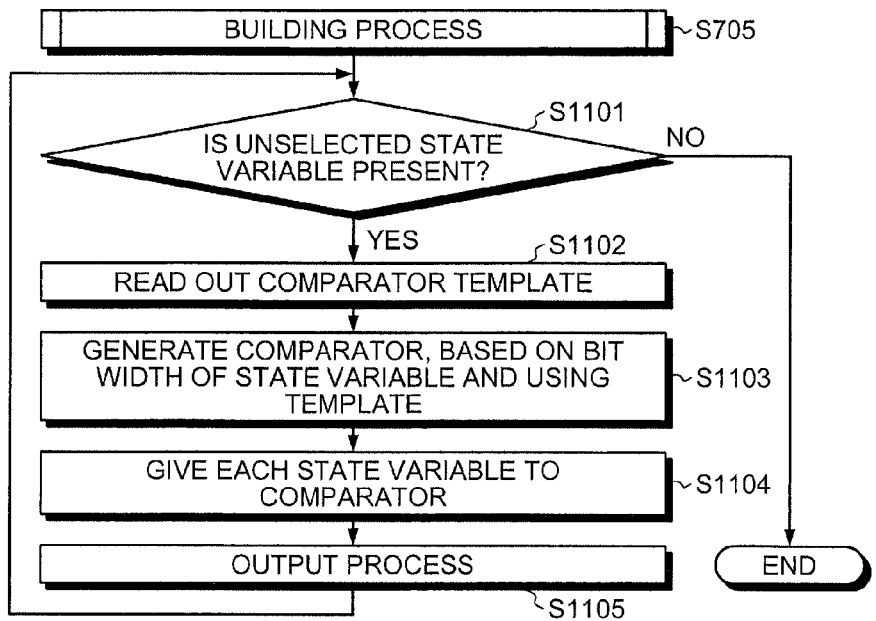
FIG. 11 is a flowchart of detailed description of a building process (step S705) depicted in FIG. 7.

FIG. 11 is a flowchart of detailed description of the building process (step S705) depicted in FIG. 7. The verification support apparatus 500 determines whether an unselected state variable is present (step S1101), and if an unselected state variable is present (step S1101: YES), the verification support apparatus 500 reads out the comparator template (step S1102).

The verification support apparatus 500, based on the bit width of the unselected state variable and using the template, generates a comparator (step S1103), and gives a state variable in the circuit model 1 and that in the circuit model 2 to the comparator (step S1104). The verification support apparatus 500 then carries out the output process (step S1105), and returns to step S1101.

At step S1101, if an unselected state variable is not present (step S1101: NO), the verification support apparatus 500 ends a series of the steps.

In the second embodiment, a state variable close to a reception FF in a reception clock domain is detected. Further, in the second embodiment, constituent elements identical to those described in the first embodiment will be denoted by the same reference numerals used in the first embodiment, and description thereof will be omitted.

Figure 12:
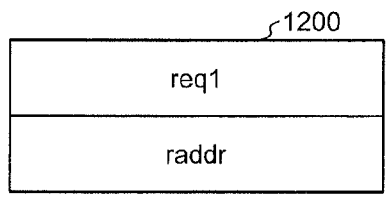
FIG. 12 is an explanatory diagram of an example of a reception FF list.

FIG. 12 is an explanatory diagram of an example of a reception FF list. A reception FF list 1200 is information indicative of which FF among FFs written in the circuit information 200 is equivalent to a reception FF. In this list, req1 and raddr are indicated as reception FFs. The reception FF list is stored in a memory device accessible by the CPU 401.

Following the process by the detecting unit 501 as described in the first embodiment, the node generating unit 502 generates nodes respectively corresponding to the variables in the circuit subject to verification. Specifically, for example, the CPU 401 detects all variables written in the circuit information 200 and generates nodes that correspond to the variables, respectively. A node corresponding to a clock-related variable is unnecessary.

Figure 13:
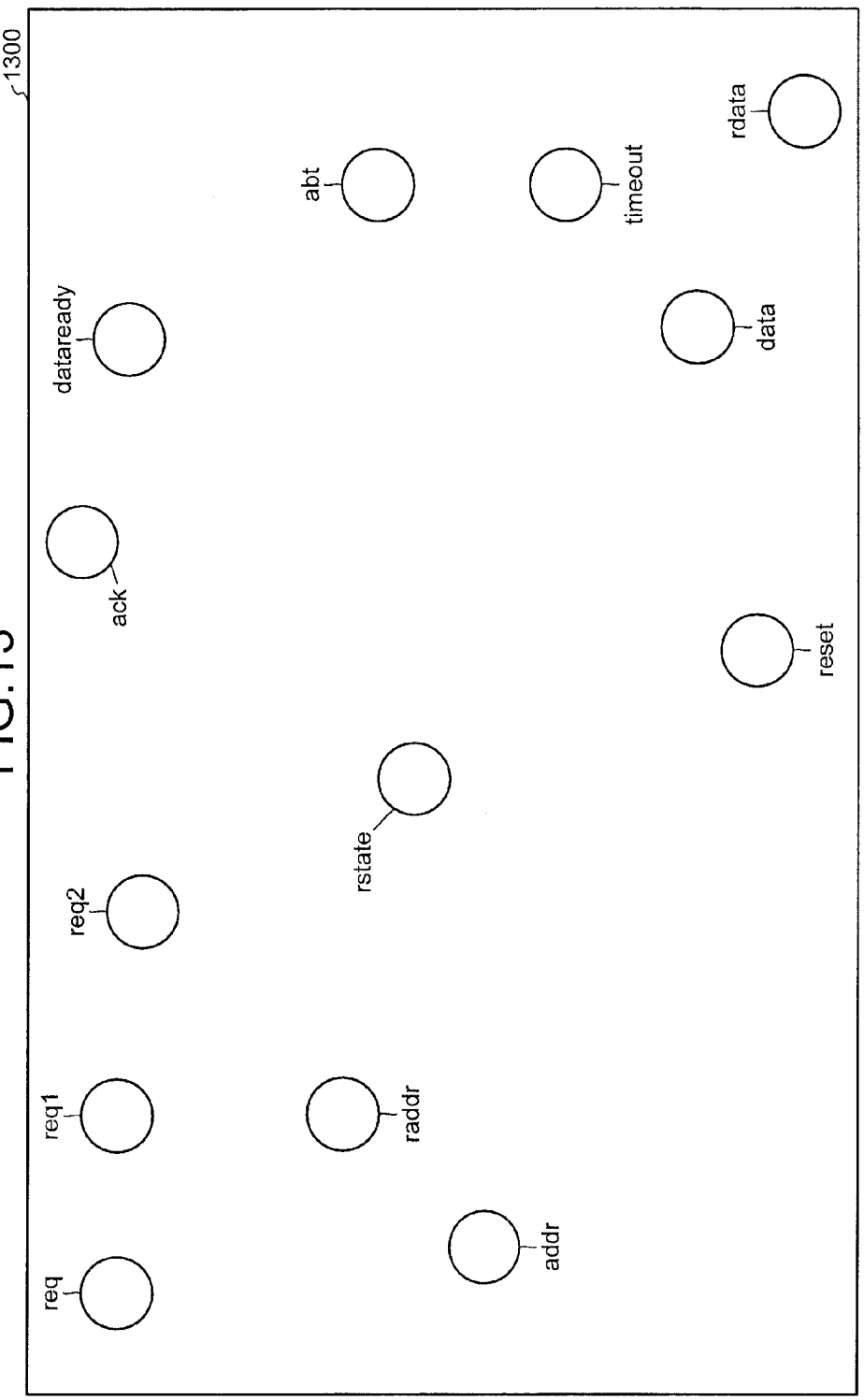
FIG. 13 is an explanatory diagram of an example of a node generation result.

FIG. 13 is an explanatory diagram of an example of a node generation result. Variables in the circuit information 200 include req, req1, req2, addr, ack, abt, data, dataready, timeout, rstate, raddr, rdata, and reset. Circles represent nodes in a graph 1300, in which the nodes respectively corresponding to the variables are arranged.

The first edge generating unit 503 generates a directional edge heading from a node corresponding to a variable at the right side of an assignment statement in the circuit toward a node corresponding to a variable at the left side of the same among the nodes generated by the node generating unit 502. Specifically, for example, the CPU 401 detects an assignment statement in the circuit information 200.

The result of assignment statement detection is as follows.
req1<=req;
req2<=req1;
raddr<=addr;
data<=rdata;

For example, the CPU 401 generates a directional edge heading from a node corresponding to a variable at the right side of a detected assignment statement toward a node corresponding to a variable at the left side of the same.

Figure 14:
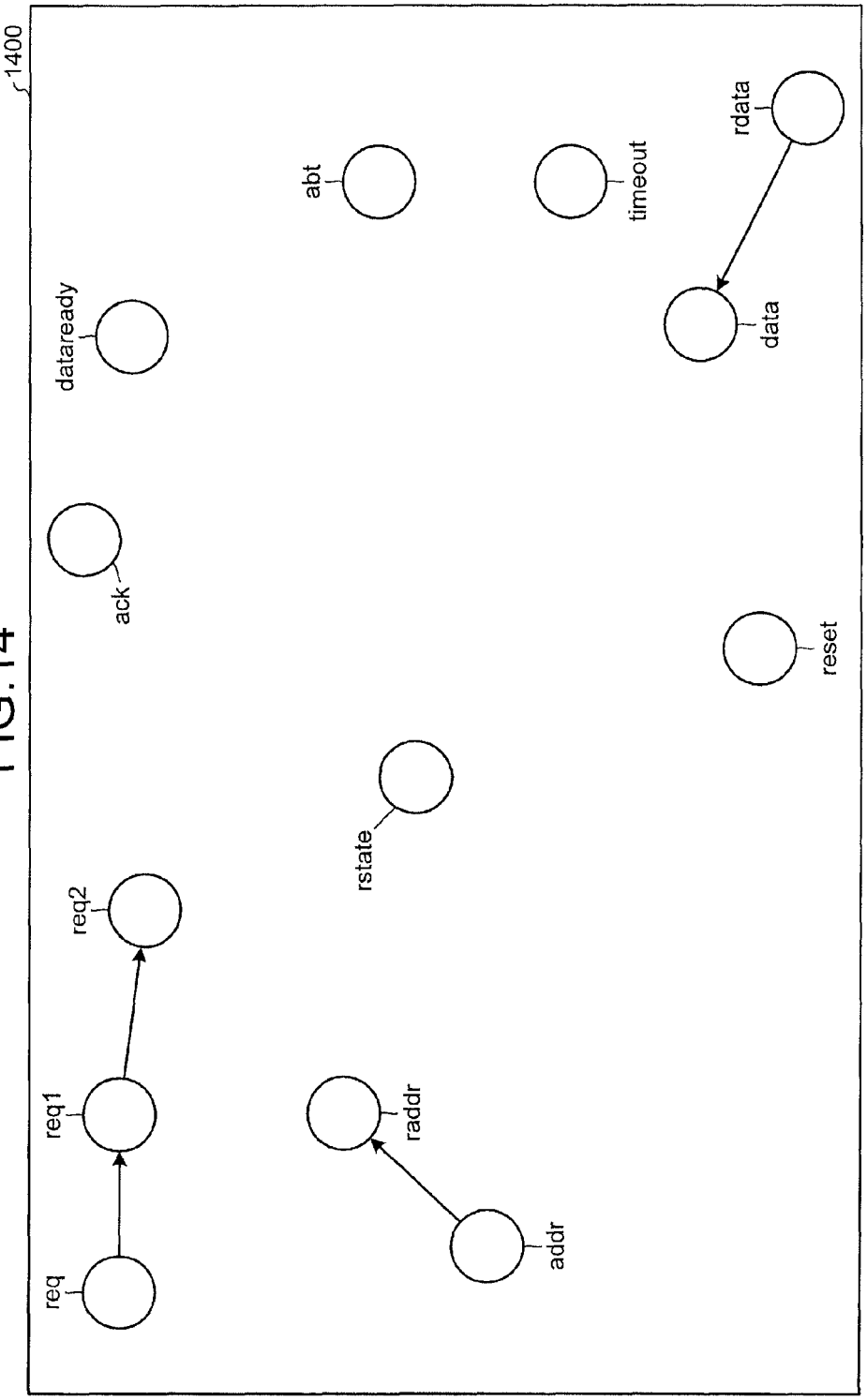
FIG. 14 is an explanatory diagram of an example of a result of directional edge generation by a first edge generating unit.

FIG. 14 is an explanatory diagram of an example of the result of directional edge generation by the first edge generating unit 503. In a case of "req1<=req", a directional edge (→) is written as an edge heading from a node corresponding to req toward a node corresponding to req1 in the graph 1400.

In the same manner, a directional edge heading from the node corresponding to req1 toward a node corresponding to req2 and a directional edge heading from a node corresponding to addr toward a node corresponding to raddr are written in the graph 1400. A directional edge heading from a node corresponding to rdata toward a node corresponding to data is also written in the graph 1400.

The second edge generating unit 504 generates a directional edge, among the nodes generated by the node generating unit 502, heading from a node corresponding to a variable included in a conditional statement in the circuit toward a node corresponding to a variable at the left side of an assignment statement to be executed based on the conditional statement.

An example of the following conditional executable statement in the circuit information 200 will be described.

---
"if(reset)begin
  ack <= 1'b0;
  abt <= 1'b0;
  rstate <= 2'b00;
end"

---

"if (reset)" is an execution condition, a variable included in the execution condition is reset, and variables at the left sides of assignment statements to be executed are ack, abt, and rstate. Hence, for example, the second edge generating unit 504 generates a directional edge heading from a node corresponding to reset toward a node corresponding to ack, a directional edge heading from the node corresponding to reset toward a node corresponding to abt, and a directional edge heading from the node corresponding to reset toward a node corresponding to rstate.

The following description means the same as "if (!reset)". A variable included in the execution condition is, therefore, reset.

---
"if(reset)begin
  . . . .
else begin"

---

Figure 15:
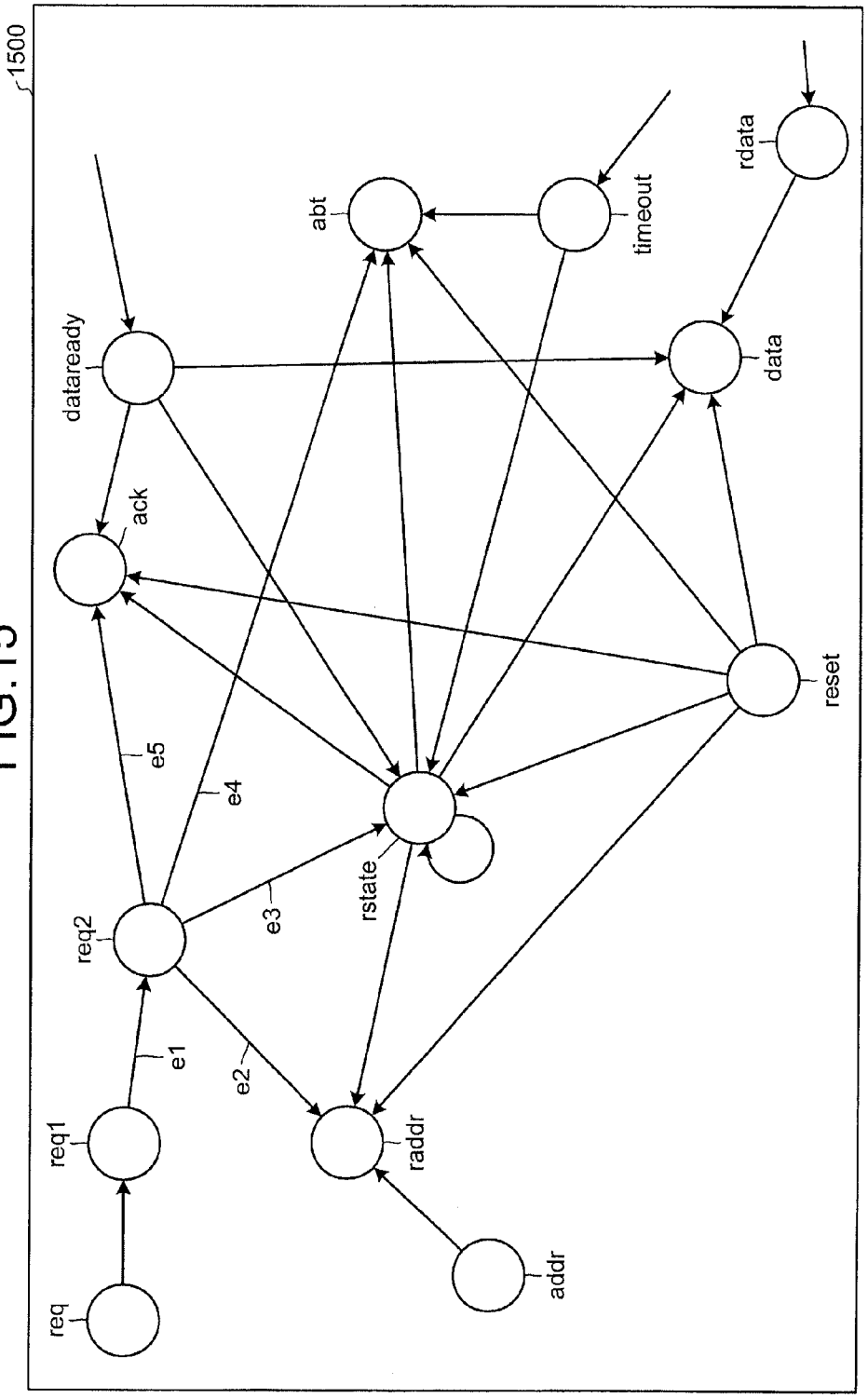
FIG. 15 is an explanatory diagram of an example of a result of directional edge generation by a second edge generating unit.

FIG. 15 is an explanatory diagram of an example of the result of directional edge generation by the second edge generating unit 504. A graph 1500 depicts the result of directional edge generation by the second edge generating unit 504. Although dataready, timeout, and rdata are not written in the circuit information 200, these variables indicate reception of some kind of data, thus directional edges are written to nodes corresponding to these variables.

The retrieving unit 505 traces directional edges from a node corresponding to a specified variable in the graph having directional edges generated by the first and second edge generating units 503 and 504 to retrieve, within the specified number of edge tracings, a node corresponding to a variable detected by the detecting unit 501.

A node that can be reached by tracing a directional edge one time from a specified node is determined to be a node separated from the specified node by distance 1, and node that can be reached by tracing directional edges n times from the specified node is determined to be a node separated from the specified node by distance n. Specifically, for example, the retrieving unit 505 retrieves all nodes within a range of the distance n to the specified node and determines a node corresponding to the variable detected by the detecting unit 501 to be a state variable. In this example, the distance n is set to 2. The distance n is, however, actually set by the verification engineer. In the second embodiment, the specified node is the node corresponding to a reception FF.

For example, the CPU 401 puts an empty set in a set S.
S={φ}

For example, the CPU 401 selects a reception FF name listed in the reception FF list 1200 and puts the selected reception FF name in the set S. For example, when req1 is selected, the following set S results.
S={req1}

Further, for example, the CPU 401 traces a directional edge e1 from a node corresponding to req1 to reach a node corresponding to req2, which is separated from the node corresponding to req1 by the distance 1. Because the set S does not include req2, the retrieving unit 505 puts req2 in the set S.

The CPU 401 then traces a directional edge e2 from the node corresponding to req2 to reach a node corresponding to raddr. Because the set S does not include raddr, the retrieving unit 505 puts raddr in the set S.

Because the node corresponding to raddr is separated from the node corresponding to req1 by the distance 2, for example, the CPU 401 returns from the node corresponding to raddr to the node corresponding to req2. Specifically, for example, the CPU 401 then traces a directional edge e3 from the node corresponding to req2 to reach a node corresponding to rstate. Because the set S does not include rstate, the retrieving unit 505 puts rstate in the set S.

Because the node corresponding to rstate is separated from the node corresponding to req1 by the distance 2, for example, the CPU 401 returns from the node corresponding to rstate to the node corresponding to req2. The CPU 401 traces directional edges e4 and e5 in the same manner as tracing the directional edge e3, to reach another variable. If the reached variable is not included in the set S, the retrieving unit 505 puts the variable in the set S.

S={req1, req2, raddr, rstate, abt, ack}

When all directional edges from the node corresponding to req2 are retrieved, the node retrieval is ended. Subsequently, for example, the CPU 401 retrieves the state variable detected by the detecting unit 501 from the set S. In this example, rstate is retrieved from the set S.

The setting unit 506 then sets the bit width of the first variable and the same of the second variable in the comparator template, to the bit width of the state variable retrieved by the retrieving unit 505. The specific process carried out by the setting unit 506 is the same as the process described in the first embodiment, and is therefore omitted in further description.

The processes carried out by the building unit 507 and the output unit 508 are the same as the processes described in the first embodiment, and are therefore omitted in further description.

Figure 16:
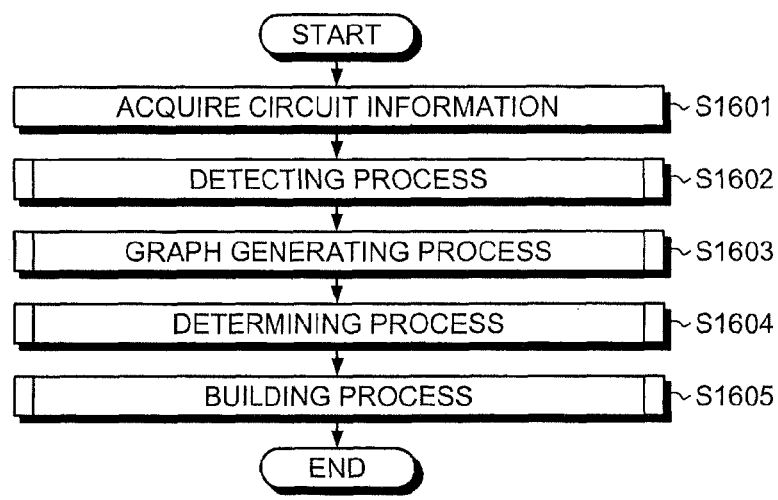
FIG. 16 is a flowchart of an example of a verification support procedure by the verification support apparatus a according to a second embodiment.

FIG. 16 is a flowchart of an example of a verification support procedure by the verification support apparatus 500 according to the second embodiment. The verification support apparatus 500 acquires the circuit information (step S1601), carries out the detection process (step S1602), and carries out a graph generating process (step S1603). The verification support apparatus 500 then carries out a determining process (step S1604) and the building process (step S1605), ending a series of processes.

Since the processing at step S1602 is identical to that at step S702 (S703, S704) depicted in FIG. 7, description of step S1602 will be omitted.

Figure 17:
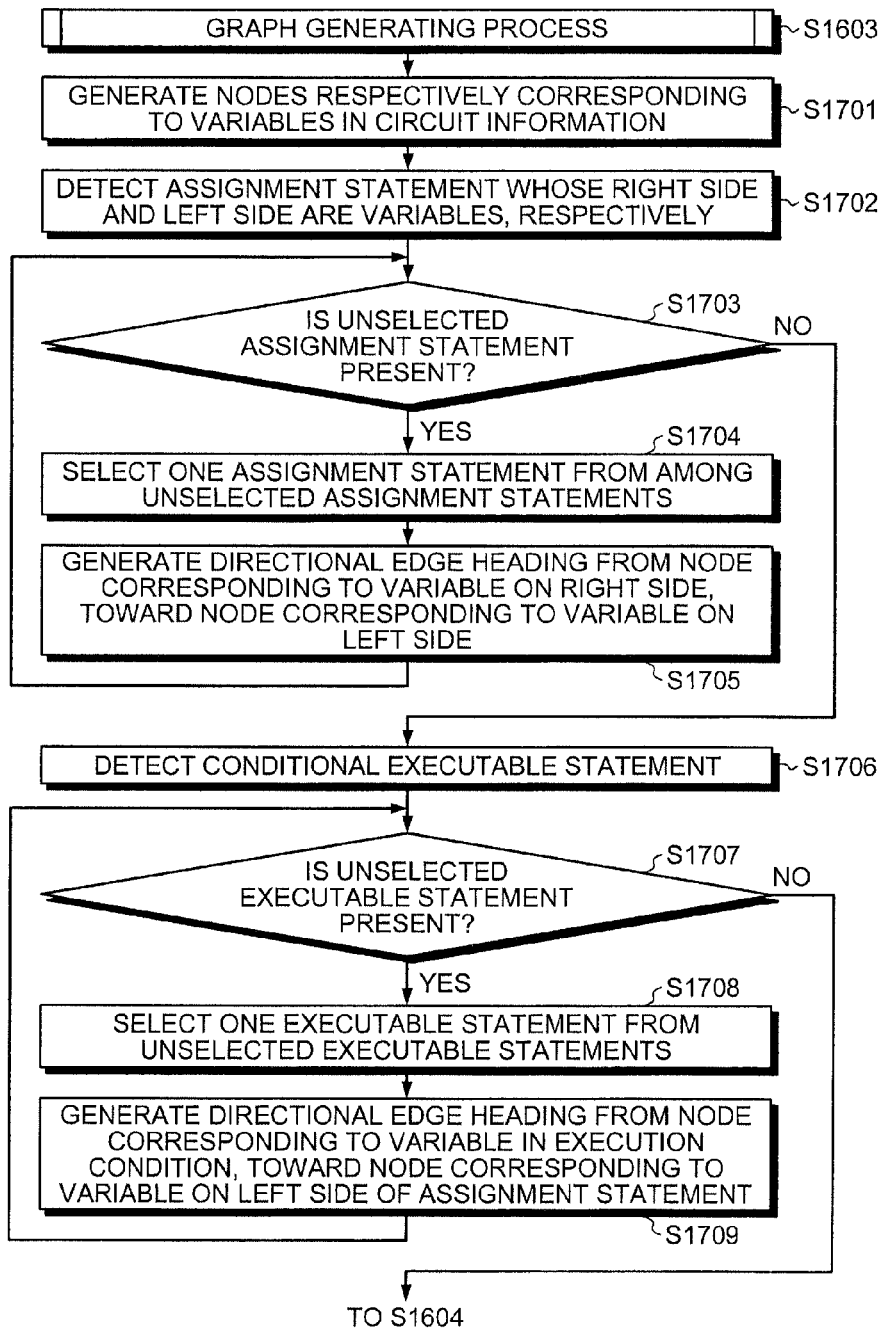
FIG. 17 is a flowchart of detailed description of a graph generating process (step S1603) depicted in FIG. 16.

FIG. 17 is a flowchart of detailed description of the graph generating process (step S1603) depicted in FIG. 16. The verification support apparatus 500 generates nodes respectively corresponding to variables in the circuit information (step S1701), and detects an assignment statement whose right side and left side are variables, respectively (step S1702).

The verification support apparatus 500 then determines whether an unselected assignment statement is present among detected assignment statements (step S1703), and if an unselected assignment statement is present (step S1703: YES), selects one assignment statement (step S1704).

The verification support apparatus 500 then generates a directional edge heading from a node corresponding to the variable on the right side of the assignment statement, toward a node corresponding to the variable on the left side (step S1705), and returns to step S1703.

At step S1703, if an unselected assignment statement is not present (step S1703: NO), the verification support apparatus 500 detects a conditional executable statement (step S1706). The verification support apparatus 500 then determines whether an unselected executable statement is present among detected executable statements (step S1707), and if an unselected executable statement is present (step S1707: YES), selects one executable statement (step S1708).

The verification support apparatus 500 then generates a directional edge heading from a node corresponding to a variable in an execution condition in the executable statement toward a variable on the left side of the assignment statement to be executed (step S1709), and returns to step S1707.

At step S1707, if an unselected executable statement is not present among detected executable statements (step S1707: NO), the verification support apparatus 500 proceeds to step S1604.

Figure 18:
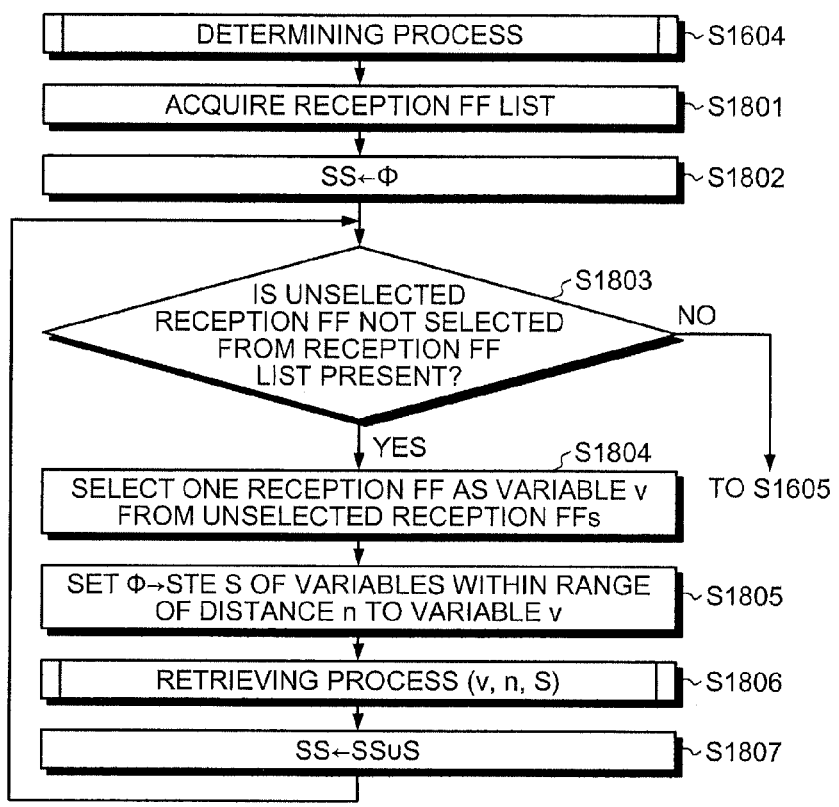
FIG. 18 is a flowchart of detailed description of a determining process (step S1604) depicted in FIG. 16.

FIG. 18 is a flowchart of detailed description of the determining process (step S1604) depicted in FIG. 16. The verification support apparatus 500 acquires the reception FF list (step S1801), and sets $\phi \rightarrow SS$ (step S1802).

The verification support apparatus 500 then determines whether an unselected reception FF not selected from the reception FF list is present (step S1803). If an unselected reception FF is present (step S1803: YES), the verification support apparatus 500 selects one reception FF as a variable v, from among unselected reception FFs (step S1804).

The verification support apparatus 500 then sets $\phi \rightarrow$set S of variables within a range of the distance n to the variable v (step S1805), carries out a retrieving process (v, n, s) (step S1806), sets $SS \cup S \rightarrow SS$ (step S1807), and returns to step S1803.

The distance n is a distance on the graph, and a variable within a range of the distance 1 to the variable v is a variable corresponding to a node that can be reached by tracing one directional edge from a node corresponding to the variable v. At step S1806, the verification support apparatus 500 carries out the retrieving process using (v, n, s) as arguments.

At step S1803, if an unselected reception FF is not present (step S1803: NO), the verification support apparatus 500 proceeds to step S1605.

Figure 19:
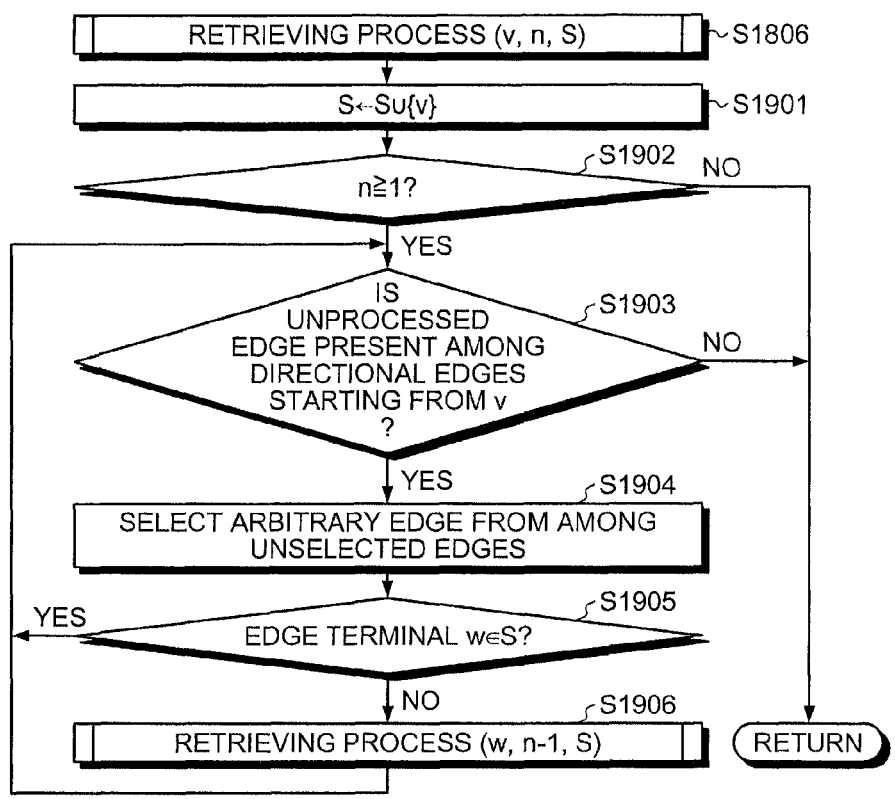
FIG. 19 is a flowchart of detailed description of a retrieving process (step S1806) depicted in FIG. 18.

FIG. 19 is a flowchart of detailed description of the retrieving process (step S1806) depicted in FIG. 18. (v, n, s) are given as arguments in the retrieving process (step S1806). The verification support apparatus 500 sets $S \cup \{v\} \rightarrow S$ (step S1901), and determines whether $n \geq 1$ is satisfied (step S1902). If $n \geq 1$ is satisfied (step S1902: YES), the verification support apparatus 500 determines whether an unprocessed edge is present among directional edges starting from v (step S1903).

If an unprocessed edge is present (step S1903: YES), the verification support apparatus 500 selects an arbitrary edge from among unprocessed edges (step S1904), and determines whether the edge terminal w∈S is satisfied (step S1905).

If the edge terminal w∈S is not satisfied (step S1905: NO), the verification support apparatus 500 carries out the retrieving process (w, n−1, S) (step S1906), and returns to step S1903. The retrieving process is carried out in the form of a regression function, and the retrieving process at step S1906 is carried out as the retrieving process at step S1806 with arguments (w, n−1, S) given thereto.

At step S1905, if the edge terminal w∈S is satisfied (step S1905: YES), the verification support apparatus 500 returns to step S1903.

At step S1902, if n≧1 is not satisfied (step S1902: NO) or at step S1903, if an unprocessed edge is not present (step S1903: NO), the verification support apparatus 500 returns to the starting point.

For example, when the value of n is 1, n−1 is set as n at step S1906 and step S1806 is executed again. Since n−1 gives 0, determination is made at step S1902 that n≧1 is not satisfied, and RETURN follows to proceed to step S1903 in the case of the value of n being 1. Since the regression function is a known function, detailed description of the function is omitted.

Figure 20:
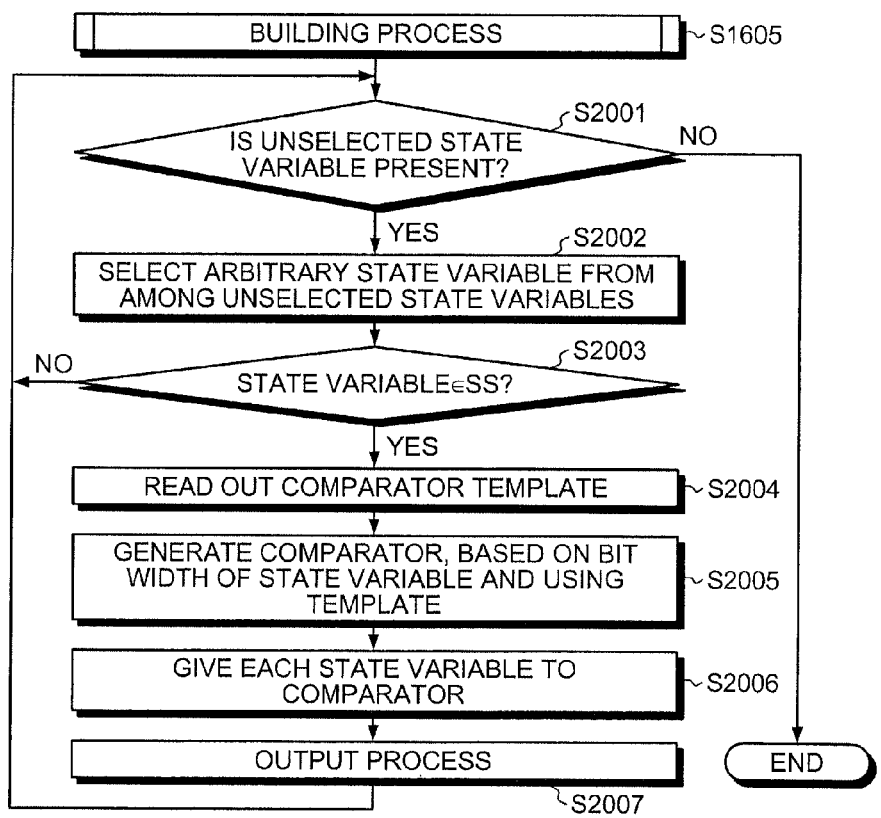
FIG. 20 is a flowchart of detailed description of a building process (step S1605) according to FIG. 16.

FIG. 20 is a flowchart of detailed description of the building process (step S1605) according to FIG. 16. The verification support apparatus 500 determines whether an unselected state variable is present (step S2001), and if an unselected state variable is present (step S2001: YES), selects an arbitrary state variable from among unselected state variables (step S2002).

The verification support apparatus 500 then determines whether state variable∈SS is satisfied (step S2003). If state variable∈SS is satisfied (step S2003: YES), the verification support apparatus 500 reads out the comparator template (step S2004). The verification support apparatus 500 then generates a comparator, based on the bit width of the state variable and using the template (step S2005), gives each state variable to the comparator (step S2006), carries out the output process (step S2007), and returns to step S2001.

At step S2003, if state variable∈SS is not satisfied (step S2003: NO), the verification support apparatus 500 returns to step S2001.

At step S2001, if an unselected state variable is not present (step S2001: NO), the verification support apparatus 500 ends a series of steps. In this manner, the test bench 100 of FIG. 1 is generated.

In the third embodiment, simulation is carried out using a simulation model generated according to the first or the second embodiment to determine whether a difference exits between series of state changes. In the third embodiment, constituent elements identical to those described in the first or second embodiment will be denoted by the same reference numerals used n the or second embodiment, and description thereof will be omitted.

Figure 21:
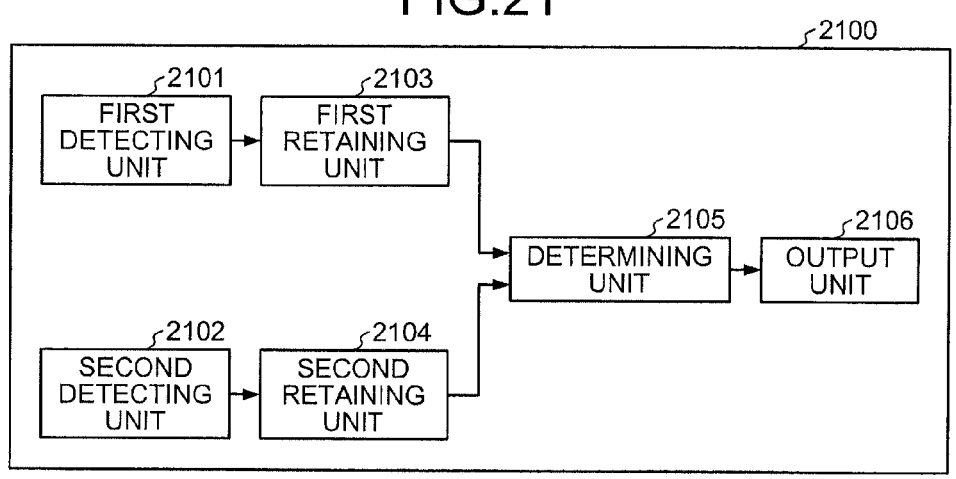
FIG. 21 is a block diagram of a functional configuration of the verification support apparatus according to a third embodiment.

FIG. 21 is a block diagram of a functional configuration of the verification support apparatus according to the third embodiment. A verification support apparatus 2100 includes a first detecting unit 2101, a second detecting unit 2102, a first retaining unit 2103, a second retaining unit 2104, a determining unit 2105, and an output unit 2106. These functional units (the first detecting unit 2101 to the output unit 2106), are implemented, for example, by the CPU 401 executing programs stored in a memory devices such as the ROM 402, the RAM 403, the magnetic disk 405, and the optical disk 407 depicted in FIG. 4, or via the I/F 409.

In the following description, the 2-bit variable rstate is assumed to be a state variable.

State0: rstate=2'b00
State1: rstate=2'b01
State2: rstate=2'b10
State3: rstate=2'b11

The first detecting unit 2101 detects a state change of a circuit that is subject to verification, the state change occurring when input data is given to the circuit. For example, the CPU 401 detects a change in rstate in the circuit model 1.

The second detecting unit 2102 detects a state change of the circuit occurring when input data partially altered randomly by a CDC model is given to a circuit. For example, the CPU 401 detects a change in rstate in the circuit model 2.

The first retaining unit 2103 sequentially stores the state at the time of state change detection each time a state change is detected by the first detecting unit 2101. For example, the first retaining unit 2103 is an FIFO buffer, in which the state at the time of state change detection is stored sequentially by the CPU 401.

The second retaining unit 2104 sequentially stores the state at the time of state change detection each time a state change is detected by the second detecting unit 2102. For example, the second retaining unit 2104 is an FIFO buffer, in which the state at the time of state change detection is stored sequentially by the CPU 401.

Series of states stored respectively in the first retaining unit 2103 and the second retaining unit 2104 are, therefore, series of state transitions.

The determining unit 2105 determines whether a difference exists between states stored in the first retaining unit 2103 and states stored in the second retaining unit 2104. For example, the CPU 401 compares values in both FIFO buffers with each other in the order stored to the FIFO buffers to determine whether a difference exists between the compared values.

The output unit 2106 has a function of outputting a determination result. Specifically, for example, the output unit 2106 outputs inconsistency information when the CPU 401 determines that a state stored in the first retaining unit 2103 is different from a state stored in the second retaining unit 2104. Forms of output include display on the display 408, printout by the printer 413, and transmission to an external device through the I/F 409. Inconsistency information may be stored in such a memory device as the RAM 403, the magnetic disk 405, and the optical disk 407.

A change in rstate will be described for a first instance and a second instance.

The following is a first instance of a change in rstate at each rising edge of clk2.

change in rstate in the circuit model 1 at each rising edge of clk2: State0→State1→State1→State2
change in rstate in the circuit model 2 at each rising edge of clk2: State0→State1→State1→State1→State2

The first detecting unit 2101 thus gives the following detection result.

state transition of the state variable in the circuit model 1: State0→State1→State2

The second detecting unit 2102 thus gives the following detection result.

state transition of the state variable in the circuit model 2: State0→State1→State2

The first detecting unit 2101 and the second detecting unit 2102 detect a change of a state only and do not detect the type of a state. Therefore, if State0 continues to occur, the first and the second detecting units 2101 and 2102 detect nothing because the state itself is not changing.

The first retaining unit 2103 stores State0 first, then stores State1, and finally stores State2.

The second retaining unit 2104 stores State0 first, then stores State1, and finally stores State2.

Subsequently, the determining unit 2105 determines in the order of stored states whether a difference exists between states stored in the first retaining unit 2103 and states stored in the second retaining unit 2104. First, the first retaining unit 2103 and the second retaining unit 2104 each store state0 and thus, the determining unit 2105 determines that the states in both retaining units are the same. Secondly, the first retaining unit 2103 and the second retaining unit 2104 each store state1 and thus, the determining unit 2105 determines that states in both retaining units are the same. Lastly, the first retaining unit 2103 and the second retaining unit 2104 each store state2 and thus, the determining unit 2105 determines that the states stored in both retaining units are the same and that no difference exists between the states stored in the respective retaining units.

The following is a second instance of a change in rstate at each rising edge of clk2.

change in the state variable in the circuit model 1 at each rising edge of clk2: State0→State1→State1→State2 change in the state variable in the circuit model 2 at each rising edge of clk2: State0→State1→State1→State3

The first detecting unit 2101 thus gives a series of detection results as follows.

state transition of the state variable in the circuit model 1: State0→State1→State2

The second detecting unit 2102 thus gives a series of detection results as follows.

state transition of the state variable in the circuit model 2: State0→State1→State3

The first retaining unit 2103 stores State0 first, then stores State1, and finally stores State2.

The second retaining unit 2104 stores State0 first, then stores State1, and finally stores State3.

Subsequently, the determining unit 2105 determines in the order of the stored states whether a difference exists between the states stored in the first retaining unit 2103 and the states stored in the second retaining unit 2104. First, the first retaining unit 2103 and the second retaining unit 2104 each store state0 and thus, the determining unit 2105 determines that the states in both retaining units are the same. Secondly, the first retaining unit 2103 and the second retaining unit 2104 each store state1 and thus, the determining unit 2105 determines that the states in both retaining units are the same. Lastly, the first retaining unit 2103 stores State2 while the second retaining unit 2104 stores State3 and thus, the determining unit 2105 determines that a difference exists between the states in the retaining units.

The output unit 2106 has a function of outputting a determination result. Specifically, for example, the output unit 2106 outputs inconsistency information when the CPU 401 determines that a difference exists between states stored in the retaining units. Forms of output include display on the display 408, printout by the printer 413, and transmission to an external device through the I/F 409. Inconsistency information may be stored in a memory device such as the RAM 403, magnetic disk 405, and optical disk 407.

The effect of CDC appears as a shift in signal change timing (cycle unit) even in a properly designed logic circuit. Simply comparing the result of ordinary function verification with the result of CDC verification, cycle by cycle, ends up in detection of a number of inconsistencies (erroneous determinations). In a conventional case, the result of ordinary function verification is compared simply with the result of CDC verification at an output terminal.

In the third embodiment, for what number of cycles the same state continues is not simply detected but only the state change is detected, as described in the first and second instances, in detecting the result of CDC verification and of function verification. As a result, an erroneous determination of a fault caused by a metastable state is prevented.

In addition, comparison of detection times when state changes are detected improves verification accuracy. The first retaining unit 2103 sequentially stores a state in the circuit and a detection time each time a state change is detected by the first detecting unit 2101.

The second retaining unit 2104 sequentially stores a state in the circuit and a detection time each time a state change is detected by the second detecting unit 2102.

The determining unit 2105 determines whether a difference exists between a detection result stored in the first retaining unit 2103 and a detection result stored in the second retaining unit 2104. For example, the CPU 401 compares values in both FIFO buffers with each other in the order of being stored to the FIFO buffers to determine whether a difference exists between the values.

The determining unit 2105 further determines whether a time span between a detection time stored in the first retaining unit 2103 and a detection time stored in the second retaining unit 2104 is within a specified time.

The output unit 2106 outputs inconsistency information when the determining unit 2105 determines that the time span is not within the specified time.

In this manner, malfunction is detected when state transition series are the same but state change times are excessively different from each other.

The determining unit 2105 determines that a difference exists between the series of state changes when a difference equal to or greater than a specified number exists between the volume of data stored in the first retaining unit 2103 and the volume of data stored in the second retaining unit 2104. A large difference in data volume enables the determination of the existence of a difference between the series of state changes without carrying out state-to-state comparison. This facilitates verification and shortens a verification period.

While a series of state variables are described as a series of states, a series of state variables are not limited to a series of states but may be a series of the values of variables related to state variables. Each time a state change is detected, therefore, the first retaining unit 2103 and the second retaining unit 2104 may respectively store a variable related to a state variable. The determining unit 2105 thus may determine whether a difference exists between a variable stored in the first retaining unit 2103 and a variable stored in the second retaining unit 2104 to determine whether malfunction due to a metastable state is occurring.

In the case of rstate in the circuit information 200, variables related to the state variable are data signals related to rstate, which are, specifically, variables on the left side of assignment statements, except an assignment statement to rstate, in clock synchronization assignment statements. In this case, ack, raddr, abt, and ack are variables in addition to the state variable.

The configuration depicted in FIG. 1 is described as an example in the third embodiment. Since repeated simulations are unnecessary in function verification, however, a configuration as depicted in FIG. 22 may be adopted.

Figure 22:
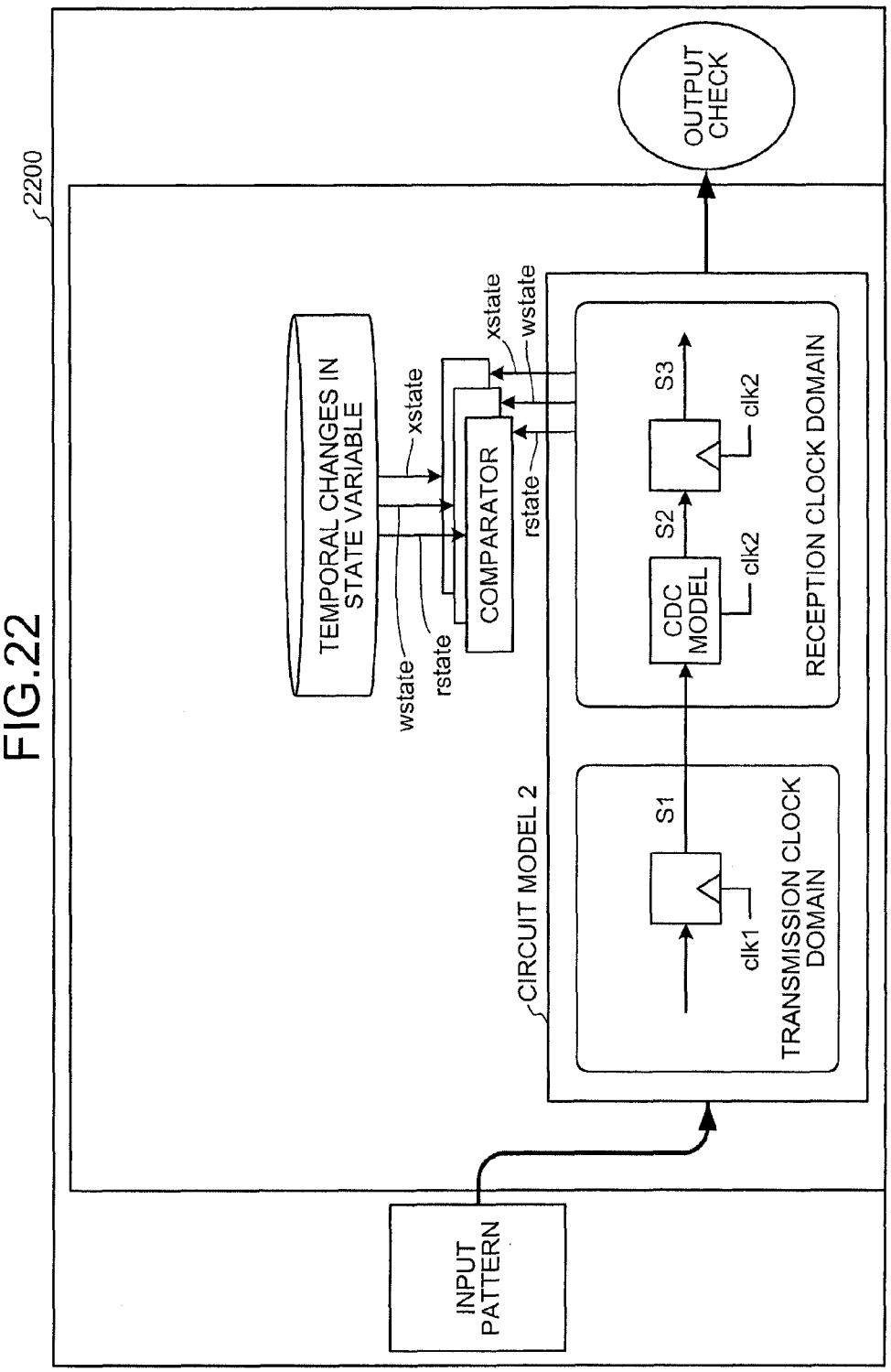
FIG. 22 is another explanatory diagram of one example of the present invention.

FIG. 22 is another explanatory diagram of one example of the present invention. When a CDC model is included, as in the case of the circuit model 2, logical values are output randomly, in which case simulations must be repeated several hundreds to thousands of times for one input pattern. When an ordinary FF model is included, as in the case of the circuit model 1, executing simulation once for one input pattern is sufficient.

In a test bench 2200, the second simulation and ensuing simulations are not executed on the circuit 1 and the result of the first simulation is applied to the circuit model 1. Temporal changes in state variables include a simulation result for each of the state variables. The test bench 2200 is a simulation model.

Figure 23:
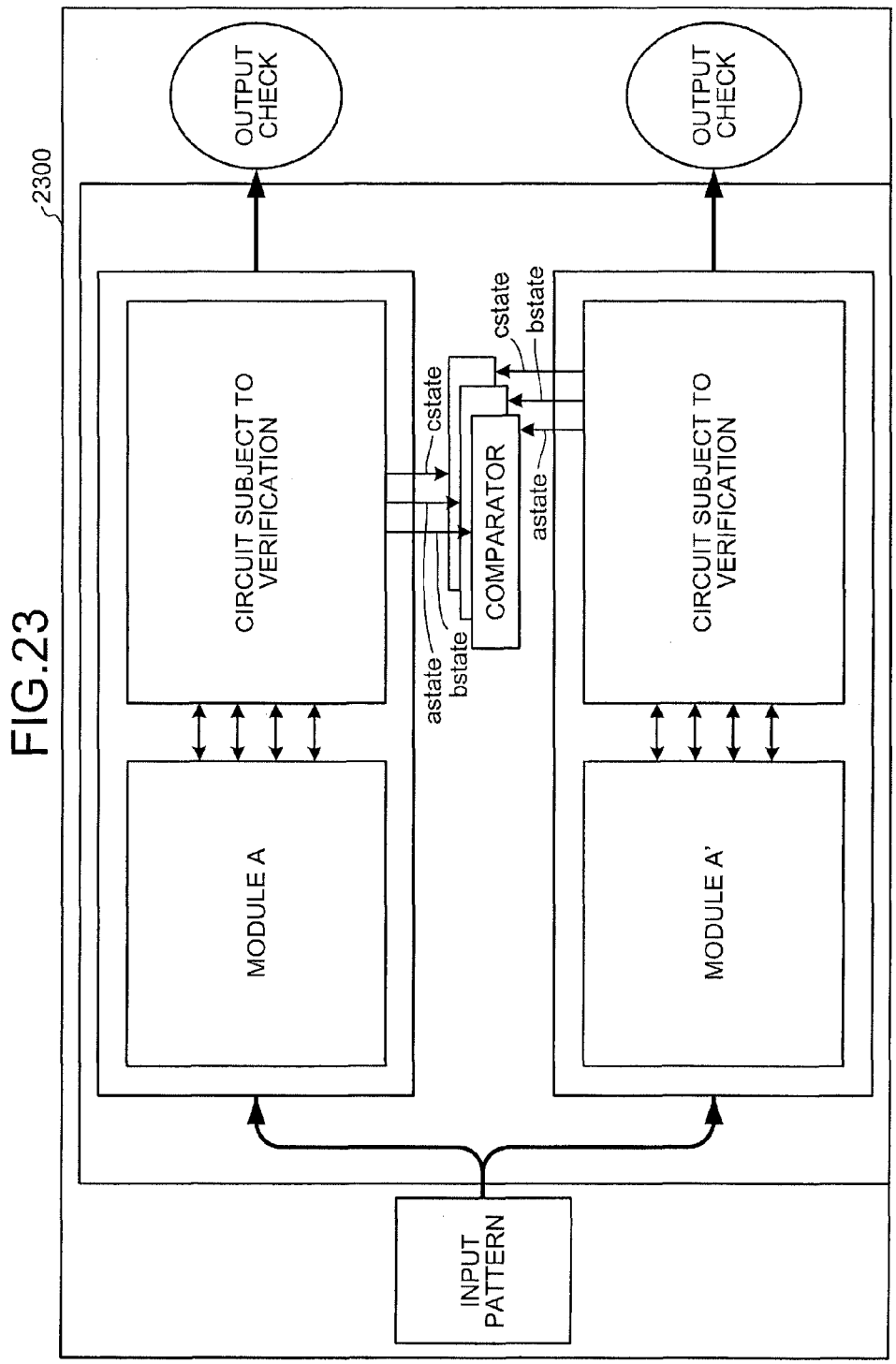
FIG. 23 is another explanatory diagram of one example of the present invention.

While the effect of CDC is taken up in the configuration depicted in FIG. 1, another configuration may be adopted, such as a configuration for conducting a test for the effect of an alteration of the surrounding environment, as depicted in FIG. 23.

FIG. 23 is another explanatory diagram of one example of the present invention. In a test bench 2300, a module A connected to a circuit subject to verification is replaced with a module A' and whether the circuit operates in the same manner as it operates when connected to the module A is verified. The module A and the module A' are the same in data output but different in output timing. The test bench 2300 is a simulation model.

In this test bench, the first detecting unit 2101 detects a state change of the circuit occurring when input data is given to the circuit at a first timing. Specifically, for example, the CPU 401 detects a state change in the circuit.

The second detecting unit 2102 detects a state change in the circuit occurring when input data is given to the circuit at a second timing different from first timing. Specifically, for example, the CPU 401 detects a state change in the circuit.

The processes carried out by the first retaining unit 2103, the second retaining unit 2104, and the determining unit 2105 are identical to the processes described above, and are therefore omitted in further description.

Figure 24:
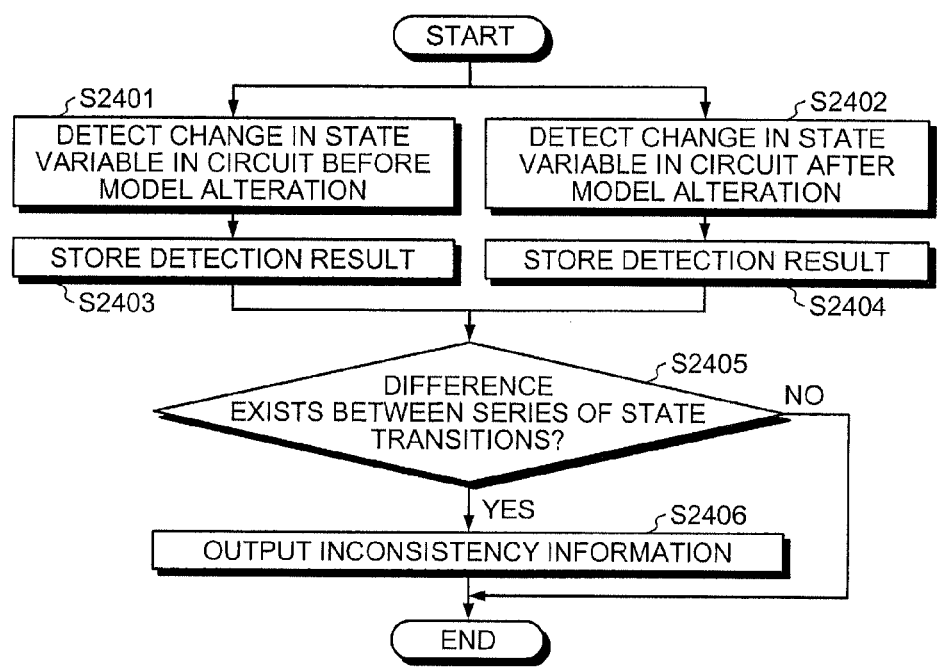
FIG. 24 is a flowchart of an example of a verification support procedure by the verification support apparatus according to the third embodiment.
Figure 25:
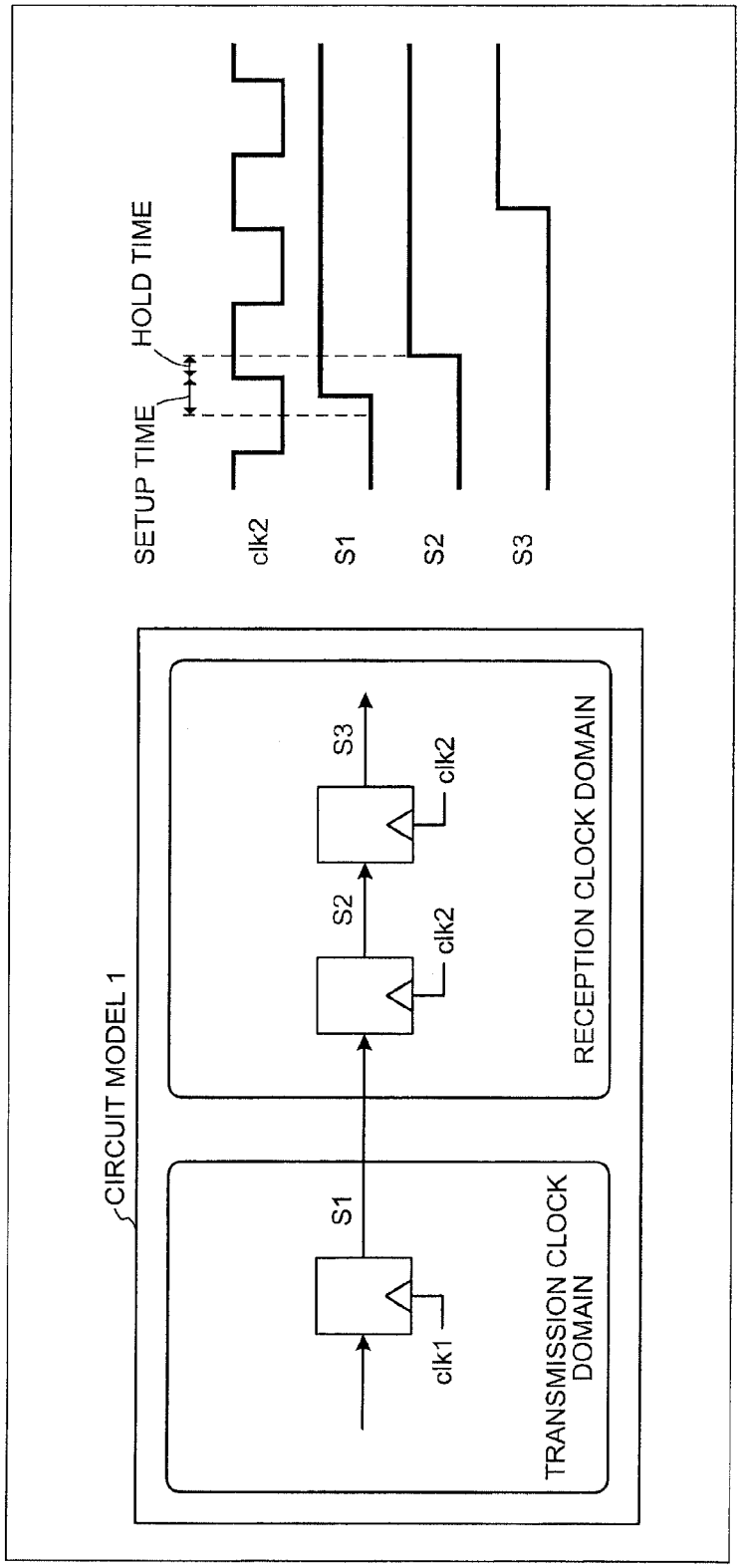
FIG. 25 is an explanatory diagram of an example of logical verification using an ordinary FF model.
Figure 26:
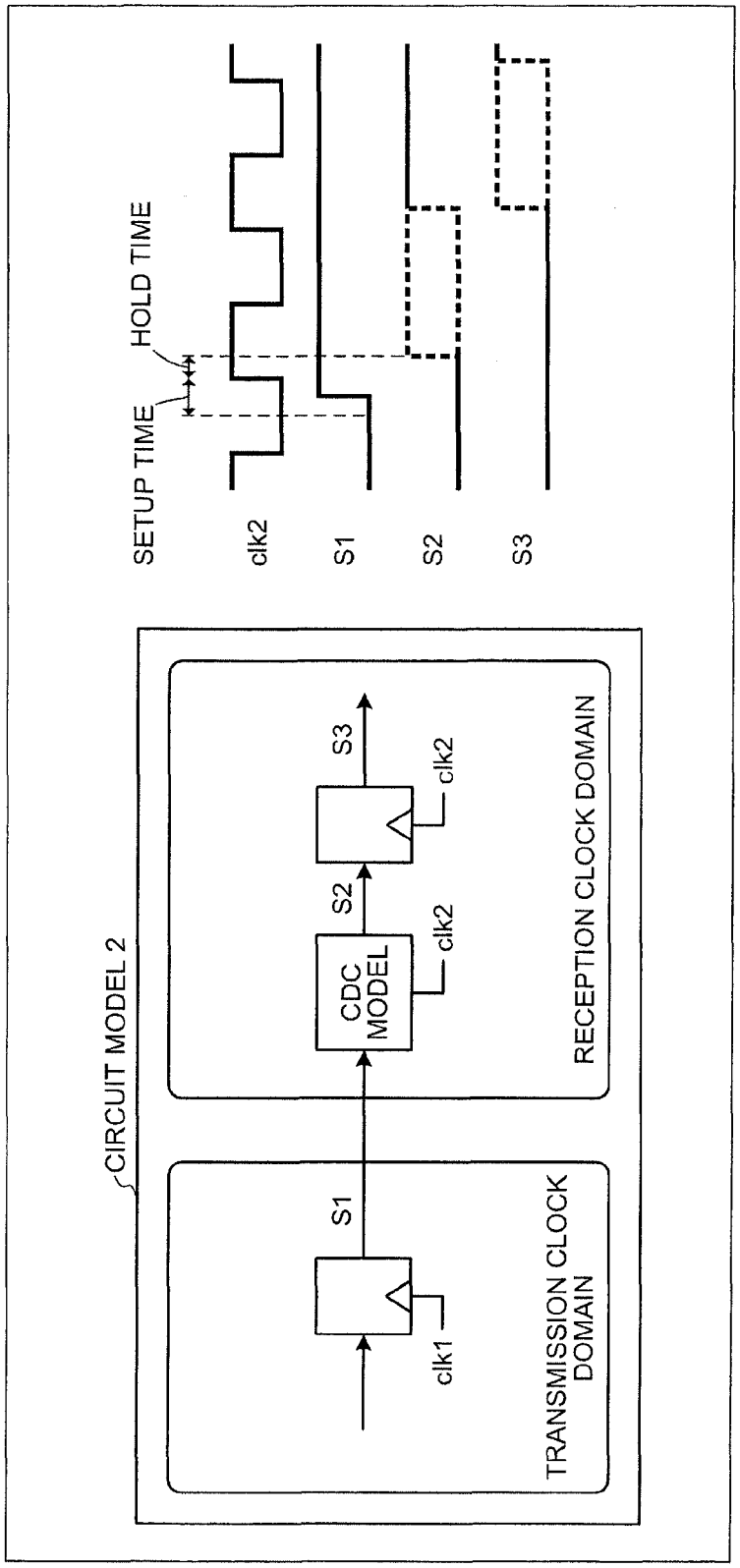
FIG. 26 is an explanatory diagram of an example of logical verification using a CDC model.

FIG. 24 is a flowchart of an example of a verification support procedure by the verification support apparatus 2100 of the third embodiment. The verification support apparatus 2100 detects a change in a state variable in a circuit before model alteration (step S2401), and stores a detection result (step S2403).

The verification support apparatus 2100 then detects a change in a state variable in the circuit after model change (step S2402), and stores a detection result (step S2404).

Subsequently, based on the detection results, the verification support apparatus 2100 determines whether a difference exists between the series of state transitions (step S2405). If a difference exists (step S2405: YES), the verification support apparatus 2100 outputs inconsistency information (step S2406), ending a series of steps.

At step S2405, if a difference is determined to not exist (step S2405: NO), the verification support apparatus 2100 ends the series of steps.

As described above, according to the embodiments, a determination is made on whether a difference exists between a series of state changes in a circuit that is subject to verification and receives input data and a series of state changes in a circuit that is subject to verification and receives the input data partially altered. As a result, malfunction is verified accurately by observing an internal state, and an erroneous determination is prevented not by comparing states cycle by cycle but by determining whether malfunction is occurring based on the existence/nonexistence of a difference between series of state changes.

A state change of a circuit subject to verification and receiving input data partially altered by a metastable state is detected. This enables accurate detection of malfunction even if transition to an erroneous internal state occurs due to a CDC-caused fault.

By storing a state change occurring in a circuit that is subject to verification and receives input data and a state change in a circuit that is subject to verification and receives the input data partially altered, both series of state transitions are identified. This enables accurate malfunction detection based on the existence/nonexistence of a difference between series of state transitions.

A state change and a detection time in a circuit subject to verification and receiving input data are stored, and a state change and a detection time in a circuit subject to verification and receiving the input data partially altered are further stored. If a gap between the detection times is excessively large, an occurrence of malfunction is determined even if the series of state transitions are the same. In this manner, malfunction is detected accurately.

A determination is made on whether a difference exists between a state change in a circuit occurring when input data is given to the circuit at a first timing and a state change in the circuit occurring when input data is given to the circuit at a second timing. As a result, malfunction is verified accurately by observing an internal state, and an erroneous determination is prevented not by comparing states, cycle by cycle, but by determining whether malfunction is occurring, based on the existence/nonexistence of a difference between the series of state changes.

As described above, according to the embodiments, a state variable is detected from a circuit subject to verification and a test bench for simulation is generated automatically. Hence, a simulation model can be generated easily, enabling observation of an internal state using a verification environment used in function verification.

A state variable that may be affected by a metastable state is identified to build a simulation model easily.

A state variable that may be affected by the propagating effect of a metastable state and that is close to a reception FF is identified. This enables automatic generation of a simulation model by which a failure caused by the metastable state is detected near the reception FF. Hence, verification is facilitated and verification precision is improved.

The verification support method described in the present embodiment may be implemented by executing a prepared program on a computer such as a personal computer and a workstation. The program is stored on a computer-readable, non-transitory medium such as a hard disk, a flexible disk, a CD-ROM, an MO, and a DVD, read out from the recording medium, and executed by the computer.

The embodiments offer an effect of accurately verifying malfunction caused by the effect of a metastable state and preventing erroneous determination using a series of state changes.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A computer-readable, non-transitory medium storing therein a verification support program that causes a computer to execute a procedure, the procedure, when executed, comprising:

first detecting a state change in a circuit and occurring when input data is given to the circuit;

second detecting a state change in the circuit and occurring when the input data partially altered is given to the circuit;

determining whether a difference exists between a series of state changes detected at the first detecting and a series of state changes detected at the second detecting;

outputting a determination result obtained at the determining;

first retaining, sequentially, a state in the circuit each time a state change is detected at the first detecting; and second retaining, sequentially, the state in the circuit each time a state change is detected at the second detecting, wherein the determining is executed to determine, in order of retained states, whether a difference exists between each state retained at the first retaining and each state retained at the second retaining, and the outputting includes outputting a determination result obtained at the determining.

2. The computer-readable, non-transitory medium according to claim 1, wherein the second detecting is executed to detect a state change in the circuit occurring when the input data partially altered by the effect of a metastable state is given to the circuit.

3. The computer-readable, non-transitory medium according to claim 1, wherein the first retaining is executed to sequentially retain the state in the circuit and a detection time, each time a state change is detected at the first detecting, the second retaining is executed to sequentially retain the state in the circuit and the detection time, each time a state change is detected at the second detecting, the determining is executed to determine, in order of retained states, whether a difference exists between each state retained at the first retaining and each state retained at the second retaining, and if determining that the difference does not exist, determining whether a time span between a detection time retained for a state at the first retaining and a detection time retained for the state at the second retaining is within a specified time, and wherein the outputting is executed to output a determination result obtained at the determining.

4. A computer-readable, non-transitory medium storing therein a verification support program, which when executed, causes a computer to perform:

first detecting a state change in the circuit and occurring when input data is given to the circuit at a first timing;

second detecting a state change in the circuit occurring when the input data is given to the circuit at a second timing different from the first timing;

determining whether a difference exists between a series of state changes detected at the first detecting and a series of state changes detected at the second detecting;

outputting a determination result obtained at the determining;

first retaining, sequentially, a state in the circuit each time a state change is detected at the first detecting; and second retaining, sequentially, the state in the circuit each time a state change is detected at the second detecting, wherein the determining is executed to determine, in order of retained states, whether a difference exists between each state retained at the first retaining and each state retained at the second retaining, and the outputting includes outputting a determination result obtained at the determining.

5. The computer-readable, non-transitory medium according to claim 4 and storing therein the verification support program, which when executed, causes the computer to further perform:

generating a node for each variable in first description information to generate a graph;

first generating, among the generated nodes, a directional edge heading from a node corresponding to a variable on a right side of an assignment statement in the first description information, toward a node corresponding to a variable on a left side of the assignment statement;

second generating, among the generated nodes, a directional edge heading from a node corresponding to a variable included in a conditional statement in the first description information, toward a node corresponding to a variable on a left side of an assignment statement to be executed based on the conditional statement;

retrieving a node corresponding to a variable in the first description information, by tracing a directional edge from a node corresponding to a specified variable in the graph having the generated directional edges; and setting a bit width of a first variable and that of a second variable in a comparator model, to a bit width of the detected variable, if a node is retrieved at the retrieving.

6. The computer-readable, non-transitory medium according to claim 5, wherein the retrieving is executed to trace a directional edge from a node corresponding to a specified variable in the graph having the generated directional edges to retrieve a node corresponding to the detected variable within a specified number of traces, and the setting is executed to set the bit width of the first variable and that of the second variable in the comparator model, to the bit width of the detected variable, if a node is retrieved at the retrieving.

7. A verification support apparatus comprising:

a first detecting unit that detects a state change in a circuit and occurring when input data is given to the circuit;

a second detecting unit that detects a state change in the circuit and occurring when the input data partially altered is given to the circuit;

a determining unit that determines whether a difference exists between a series of state changes detected by the first detecting unit and a series of state changes detected by the second detecting unit;

an output unit that outputs a determination result obtained by the determining unit a first storage retaining, sequentially, a state in the circuit each time a state change is detected by the first detecting unit; and a second storage retaining, sequentially, the state in the circuit each time a state change is detected by the second detecting unit, wherein the determining unit determines, in order of retained states, whether a difference exists between each state retained by the first storage and each state retained by the second storage, and the output unit outputs a determination result obtained by the determining unit.

8. A verification support apparatus comprising:

a processor configured to execute a procedure, the procedure, when executed, comprising:

detecting firstly a state change in a circuit and occurring when input data is given to the circuit;

detecting secondly a state change in the circuit and occurring when the input data partially altered is given to the circuit;

determining whether a difference exists between a series of state changes detected firstly and a series of state changes detected secondly;

outputting a determined result;

first retaining, sequentially, a state in the circuit each time a state change is detected at the first detecting; and second retaining, sequentially, the state in the circuit each time a state change is detected at the second detecting, wherein the determining is executed to determine, in order of retained states, whether a difference exists between each state retained at the first retaining and each state retained at the second retaining, and the outputting includes outputting a determination result obtained at the determining.

9. A verification support apparatus comprising:

a first detecting unit that detects a state change in the circuit and occurring when input data is given to the circuit at a first timing;

a second detecting unit that detects a state change in the circuit occurring when the input data is given to the circuit at a second timing different from the first timing;

a determining unit that determines whether a difference exists between a series of state changes detected by the first detecting unit and a series of state changes detected by the second detecting unit;

an output unit that outputs a determination result obtained by the determining unit;

a first storage retaining, sequentially, a state in the circuit each time a state change is detected by the first detecting unit; and a second storage retaining, sequentially, the state in the circuit each time a state change is detected by the second detecting unit, wherein the determining unit determines, in order of retained states, whether a difference exists between each state retained by the first storage and each state retained by the second storage, and the output unit outputs a determination result obtained by the determining unit.

10. A verification support apparatus comprising:

a processor configured to execute a procedure, the procedure, when executed, comprising:

firstly detecting a state change in the circuit and occurring when input data is given to the circuit at a first timing;

secondly detecting a state change in the circuit occurring when the input data is given to the circuit at a second timing different from the first timing;

determining whether a difference exists between a series of state changes detected firstly and a series of state changes detected secondly; and outputting a determined result;

first retaining, sequentially, a state in the circuit each time a state change is detected at the first detecting; and second retaining, sequentially, the state in the circuit each time a state change is detected at the second detecting, wherein the determining is executed to determine, in order of retained states, whether a difference exists between each state retained at the first retaining and each state retained at the second retaining, and the outputting includes outputting a determination result obtained at the determining.

11. A verification support apparatus having access to a memory device storing a comparator model that detects a change in a first variable and a change in a second variable, determines whether a difference exists between a series of detected changes in the first variable and a series of detected changes in the second variable, and outputs a determination result, the verification support apparatus comprising:

a detecting unit that detects in first description information concerning a circuit, both a variable representing a state and a bit width of the variable, based on a specified bit width and a specified condition;

a setting unit that sets a bit width of the first variable and that of the second variable in the comparator model, to the bit width of the variable detected by the detecting unit; and a building unit that gives the variable in the first description information to the first variable in the comparator model set by the setting unit and gives a variable identical to the variable in second description information, a portion of which differs from the first description information, to the second variable in the comparator model set by the setting unit, and builds a simulation model that is a combination of the first description information, the second description information, and the comparator model.

12. A verification support apparatus comprising:

a memory configured to store a comparator model that detects a change in a first variable and a change in a second variable, determines whether a difference exists between a series of detected changes in the first variable and a series of detected changes in the second variable, and outputs a determination result; and a processor configured to execute a procedure, the procedure, when executed, comprising:

detecting in first description information concerning a circuit, both a variable representing a state and a bit width of the variable, based on a specified bit width and a specified condition;

setting a bit width of the first variable and that of the second variable in the comparator model, to the bit width of the variable detected;

giving the variable in the first description information to the first variable in the comparator model set;

giving a variable identical to the variable in second description information, a portion of which differs from the first description information, to the second variable in the comparator model set; and building a simulation model that is a combination of the first description information, the second description information, and the comparator model.

13. A verification support method comprising:

first detecting a state change in a circuit and occurring when input data is given to the circuit;

second detecting a state change in the circuit and occurring when the input data partially altered is given to the circuit;

determining whether a difference exists between a series of state changes detected at the first detecting and a series of state changes detected at the second detecting;

outputting a determination result obtained at the determining;

first retaining, sequentially, a state in the circuit each time a state change is detected at the first detecting; and second retaining, sequentially, the state in the circuit each time a state change is detected at the second detecting, wherein the determining is executed to determine, in order of retained states, whether a difference exists between each state retained at the first retaining and each state retained at the second retaining, and the outputting includes outputting a determination result obtained at the determining.

14. A verification support method comprising:

first detecting a state change in the circuit and occurring when input data is given to the circuit at a first timing;

second detecting a state change in the circuit occurring when the input data is given to the circuit at a second timing different from the first timing;

determining whether a difference exists between a series of state changes detected at the first detecting and a series of state changes detected at the second detecting;
outputting a determination result obtained at the determining;
first retaining, sequentially, a state in the circuit each time a state change is detected at the first detecting; and
second retaining, sequentially, the state in the circuit each time a state change is detected at the second detecting,
wherein the determining is executed to determine, in order of retained states, whether a difference exists between each state retained at the first retaininq and each state retained at the second retaining, and
the outputting includes outputting a determination result obtained at the determining.

15. A verification support method comprising:
accessing a memory device storing therein a comparator model that detects a change in a first variable and a change in a second variable, determines whether a difference exists between a series of detected changes in the first variable and a series of detected changes in the second variable, and outputs a determination result;
detecting in first description information concerning a circuit, both a variable representing a state and a bit width of the variable, based on a specified bit width and a specified condition;
setting a bit width of the first variable and that of the second variable in the comparator model, to the bit width of the variable detected at the detecting; and
building a simulation model that is a combination of the first description information, the second description information, and the comparator model, by giving the variable in the first description information to the first variable in the comparator model set at the setting and giving a variable identical to the variable in second description information, a portion of which differs from the first description information, to the second variable in the comparator model set at the setting.

* * * * *